United States Patent
Suzuki et al.

(10) Patent No.: US 8,536,540 B2
(45) Date of Patent: Sep. 17, 2013

(54) CHARGED PARTICLE BEAM APPARATUS AND METHOD FOR STABLY OBTAINING CHARGED PARTICLE BEAM IMAGE

(75) Inventors: Makoto Suzuki, Hitachinaka (JP); Kenji Tanimoto, Hitachinaka (JP); Takuma Yamamoto, Mito (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/381,953

(22) PCT Filed: May 14, 2010

(86) PCT No.: PCT/JP2010/003260
§ 371 (c)(1),
(2), (4) Date: Jan. 1, 2012

(87) PCT Pub. No.: WO2011/001586
PCT Pub. Date: Jan. 6, 2011

(65) Prior Publication Data
US 2012/0126118 A1    May 24, 2012

(30) Foreign Application Priority Data
Jul. 3, 2009  (JP) ................................. 2009-158370

(51) Int. Cl.
*H01J 37/26* (2006.01)

(52) U.S. Cl.
USPC ...... 250/442.11; 250/306; 250/307; 250/310; 250/311

(58) Field of Classification Search
USPC ............ 250/306, 307, 309, 310, 311, 440.11, 250/441.11, 442.11, 492.1, 492.3
See application file for complete search history.

(56) References Cited

U.S. PATENT DOCUMENTS

| | | | |
|---|---|---|---|
| 6,903,338 B2 | 6/2005 | Mankos et al. | |
| 2007/0221844 A1 | 9/2007 | Yamanashi et al. | |
| 2008/0073562 A1 * | 3/2008 | Suzuki | 250/440.11 |
| 2008/0308743 A1 * | 12/2008 | Mizuochi et al. | 250/440.11 |
| 2009/0166557 A1 | 7/2009 | Makino et al. | |

FOREIGN PATENT DOCUMENTS

| | | | |
|---|---|---|---|
| JP | 2000-182561 A | | 6/2000 |
| JP | 2000-329662 A | | 11/2000 |
| JP | 2004-014251 A | | 1/2004 |
| JP | 2004014251 A | * | 1/2004 |
| JP | 2004-235149 A | | 8/2004 |
| JP | 2006-234789 A | | 9/2006 |
| JP | 2007-258017 A | | 10/2007 |
| JP | 2008-311351 A | | 12/2008 |

* cited by examiner

*Primary Examiner* — Michael Logie
(74) *Attorney, Agent, or Firm* — Miles & Stockbridge P.C.

(57) ABSTRACT

Since charging characteristics differ between the outer circumferential portion and the center portion of a sample to be inspected, equivalent inspection sensitivities cannot be obtained in the outer circumferential portion and the center portion of the sample to be inspected. A sample cover is provided in the outer circumferential portion of a sample holder on which the sample to be inspected is placed. Charging characteristics of the sample cover are changed according to charging characteristics of the sample to be inspected. Consequently, uniform charged states can be formed in the outer circumferential portion and the center portion of the sample. Inspection/observation of the outer circumferential portion of the sample can be realized at higher sensitivity than in the past.

14 Claims, 20 Drawing Sheets

(a)

(b)

(a)

(b)

(a)

(b)

(a)

(b)

(a)

(b)

CHARGED PARTICLE BEAM APPARATUS AND METHOD FOR STABLY OBTAINING CHARGED PARTICLE BEAM IMAGE

TECHNICAL FIELD

The present invention relates to a charged particle beam apparatus that irradiates a charged particle beam on a sample and detects a signal secondarily generated from the sample to obtain an image and a method for performing inspection of the sample on the basis of the image.

BACKGROUND ART

As an inspection apparatus for a semiconductor device and a wafer, an apparatus employing a charged particle beam apparatus that irradiates a charged particle beam on a sample held in a vacuum sample chamber and detects a signal secondarily generated from the sample to obtain an image is widely used. When a defect is present in a sample to be inspected that is an inspection target of the inspection apparatus, an amount or a state of generated secondary electrons changes. The inspection apparatus to which a charged particle beam is applied acquires an image of a region including a defective place, compares the image with an image of a normal place, and inspects the image to thereby specify the defective place. An image contrast due to the secondary electron signal is sensitive to the surface potential of the sample. Therefore, a charged particle beam inspection apparatus can detect defects related to electrical characteristics present in a circuit pattern of a semiconductor wafer, which cannot be detected by an optical inspection apparatus, for example, defects such as short circuit, disconnection, and opening failure of a hole (hereinafter, electrical defects).

Since the defect inspection is a detecting method by comparison and inspection, in order to enable detection of a defect, it is necessary that there is difference in an image contrast (hereinafter referred to as potential contrast) between the defect image and the image of the normal place. Therefore, in order to detect an electrical defect with high sensitivity, it is necessary to charge a sample surface before observation or during observation to provide a difference in surface potential between a defective place and a normal place.

It is known that charging of a wafer progresses as a kind of a relaxation phenomenon. When the wafer is charged, a positive or negative voltage is applied to an electrode, which is referred to as a charging control electrode, set immediately above the wafer and a charged particle beam is irradiated on the wafer in that state. Secondary electrons generated from the wafer are absorbed in the control electrode when the voltage applied to the control electrode is positive and are returned to the wafer when the voltage applied to the control electrode is negative. Therefore, a shortage state of electrons or an excess state of electrons is formed on the wafer according to the polarity of the applied voltage to the control electrode. As a result, it is possible to charge the wafer to a desired positive or negative value according to the polarity of the applied voltage to the charging control electrode. Irrespective of to which polarity the wafer is charged, the wafer is charged in a direction in which a wafer surface voltage approaches the voltage of the charging control electrode. Therefore, when the wafer is charge to a voltage generally equal to the control voltage, incident electrons and electrons generated from the wafer are balanced and the surface voltage of the wafer is stabilized.

Various methods have been developed concerning a charging method of a sample to be inspected. However, basically, a charged state is formed on the basis of the principle explained above. For example, JP Patent Publication (Kokai) No. 2006-234789 (Patent Literature 1) discloses an invention for preliminarily irradiating an electron beam on a sample to be inspected from an electron source (a flood gun) different from a beam for inspection and charging the sample before irradiation of the beam for inspection.

Defects present in a circuit pattern on a semiconductor wafer often concentrate in a range of several tens millimeters from the outermost circumference of a wafer (hereinafter referred to as wafer outer circumferential portion) for convenience of a manufacturing process. Therefore, it is necessary to highly accurately inspect the wafer outer circumferential portion. However, a wafer end is a boundary surface between the wafer and a vacuum (or the atmosphere) and an electric field (hereinafter, peripheral electric field) is formed on the boundary surface. A charged particle beam irradiated on a sample is bent and distortion and positional deviation of an image occurs because of distortion of the peripheral electric field.

In FIG. 19, a peripheral electric field formation mechanism of a wafer end that occurs when a wafer is charged by the method of using the flood gun is schematically shown. FIG. 19(a) corresponds to positive charging and FIG. 19(b) corresponds to negative charging. In a charged particle beam microscope, for protection of the wafer end, usually, the diameter of a wafer holder 1902 is designed larger than the diameter of the wafer. Therefore, a part of an irradiated electron beam 1901 irradiated to charge the wafer is also irradiated on a wafer holder circumferential edge 1907 on the outer side of the wafer. However, since the wafer holder is usually made of metal, if a potential difference occurs, an electric current flows to the wafer holder and potential fluctuation does not occur in the wafer holder circumferential edge.

When a voltage 1906 positive with respect to a wafer 1903 is applied to a control electrode 1904 (FIG. 19(a)), secondary electrons 1905 are generated from the wafer and the wafer is charged in positive polarity. On the other hand, since the potential does not change in the wafer holder circumferential edge 1907 on the outer side of the wafer, the wafer holder circumferential edge 1907 relatively has negative polarity with respect to the wafer charged in the positive polarity. As a result, a part of secondary electrons 1908 generated from the wafer holder are supplied to a wafer outer circumferential portion 1909 and the positive charging of the outer circumferential portion 1909 is weakened.

When a voltage 1910 negative with respect to the wafer 1903 is applied to the control electrode 1904 (FIG. 19(b)), the secondary electrons 1905 generated from the wafer are returned to the wafer itself and the wafer is charged in negative polarity. On the other hand, since the potential does not change in the wafer holder circumferential edge 1907, the wafer holder circumferential edge 1907 relatively has positive potential with respect to the wafer charged in the negative polarity. As a result, a part of the electrons returned to the wafer outer circumferential portion 1909 or secondary electrons 1911 generated in the wafer outer circumferential portion are supplied to the wafer holder circumferential edge 1909 and the negative charging of the wafer circumferential portion 1909 is weakened. From these results, the charging potential of the wafer outer circumferential portion is different from the charging potential of the wafer center portion.

As a method of suppressing such an effect of the peripheral electric field, JP Patent Publication (Kokai) No. 2004-235149 (Patent Literature 2) disclosed a technique for arranging a ring-like conductive member on the outer side of a wafer holder that holds a wafer (hereinafter, wafer holder circumferential edge), applying a DC voltage to the conductive member on which an inspection beam is being irradiated, and reducing the influence of electric field distortion on an electron beam made incident on the wafer outer circumferential portion. The invention disclosed in this literature has an object of, rather than charging control, relaxing, with potential applied to the ring-like conductive member, the gradient of a peripheral electric field formed at a wafer end and enabling the inspection beam to accurately reach a sample surface.

CITATION LIST

Patent Literature

Patent Literature 1: JP Patent Publication (Kokai) No. 2006-234789

Patent Literature 2: JP Patent Publication (Kokai) No. 2004-235149 (corresponding U.S. Pat. No. 6,903,338)

SUMMARY OF INVENTION

Technical Problem

In the charged particle beam inspection apparatus, as explained above, inspection performance for the wafer end is important. Therefore, it is also required to form, at the wafer end, a charged state same as a charged state in the wafer center portion. However, in the preliminary charging method in the past, it is difficult to uniformly charge the entire surface of the wafer. For example, even if the method of applying a DC voltage to a member arranged on the outer side of the wafer described in Patent Literature 2 is applied to preliminary charging, it is difficult to form uniform charging. A reason for the difficulty is explained below with reference to FIGS. 20(a) and (b).

Now, it is assumed that an electrode 2001 is arranged via an insulating material 2002 in the outer circumferential portion of the wafer shown in FIGS. 19(a) and (b) and potential same as the potential of the charging control electrode is applied to the electrode 2001. In FIG. 20(a), this is shown in the case of positive charging. In this case, secondary electrons generated from the wafer holder circumferential portion 1907 shown in FIG. 19(a) are dispersed into secondary electrons 1908 and 1908' and respectively reach the wafer end 1909 and the electrode 2001. Therefore, the effect of weakening the positive charging shown in FIG. 19(a) is considered to be suppressed. Similarly, in the case of the negative charging, a positive electric field formed by the positive charging of the wafer holder circumferential portion 1907 is neutralized by a negative electric field formed by the negative potential applied to the electrode 2001. Therefore, the effect of weakening the negative charging shown in FIG. 19(b) is considered to be suppressed.

The charging of the wafer is a phenomenon that develops while secondary electrons generated in the wafer and an electric field 2003 formed by the charging control electrode and electrical characteristics of the wafer complicatedly interact with each other. Therefore, in order to form a uniform charged state in the wafer center portion and the outer circumferential portion, it is desirable to form the same charging forming environment in the wafer center portion and the circumferential portion as much as possible to thereby form a charged state. However, as shown in FIG. 20(b), when a voltage substantially equal to final wafer potential is applied to the electrode 2001 arranged in the wafer outer circumferential portion, in the beginning of charging, since a charging amount of the wafer is small, an electric field distribution formed at the wafer end is different from an electric field distribution formed in the wafer center portion. Therefore, it is difficult to form the same charged state in the wafer center portion and the outer circumferential portion.

Theoretically, if the applied voltage to the electrode 2001 is controlled to an appropriate value, it may be possible to control the charging potential in the wafer center portion and the charging potential in the circumferential portion to be the same. However, the electric field distribution itself formed on the wafer depends on the balance of a present charging potential of the wafer and an applied voltage to the control electrode and fluctuates every moment according to the progress of charging. Therefore, it is necessary to cause an optimum applied voltage to the electrode 2001 to fluctuate according to the progress of charging. It is extremely difficult to calculate a waveform of such a complicated applied voltage.

In addition, there is difficulty of inspecting wafers having different charging characteristics. In the case of the inspection apparatus, the inspection apparatus needs to inspect a variety of wafers flowing on a manufacturing line for semiconductor devices. These wafers have subtly different charging characteristics because of various causes such as a circuit pattern formed on a substrate and a wiring material or a substrate material. It should be stated that it is complicated and substantially impossible to calculate an optimum value of the applied voltage waveform for each of the wafers having such a variety of charging characteristics.

Therefore, it is an object of the present invention to provide a charged particle beam inspection apparatus that can substantially uniformly charge the wafer outer circumferential portion and the wafer center portion. Further, it is an object of the present invention to provide a charged particle beam inspection apparatus that can substantially uniformly charge the wafer outer circumferential portion and the wafer center portion even if a type of a wafer is changed.

Solution to Problem

In the present invention, in a charged particle beam apparatus that irradiates a primary charged particle beam on a sample to be inspected, detects and images secondary charged particles generated by the irradiation, and inspects the sample to be inspected using the image, a member having charging characteristics substantially the same as those of a wafer is arranged around the sample to be inspected, whereby substantially the same quality charging formation environments in the wafer circumferential portion and the wafer center portion. The charging characteristic member is electrically placed at potential substantially the same as the potential of a wafer holder. In the following explanation, in this specification, the charging characteristic member is referred to as sample cover.

Further, in order to cope with a variety of wafers, the present invention is characterized in that the electrical characteristics of the sample cover are changed according to a wafer. Consequently, it is possible to provide a charged particle beam inspection apparatus that can substantially uniformly charge the wafer outer circumferential portion and the wafer center portion even if a type of a wafer changes.

There are various methods of implementing, in an apparatus, a function of changing electrical characteristics of the sample cover according to a wafer. However, details of the methods are explained in embodiments.

Advantageous Effects of Invention

According to the present invention, it is possible to provide an electron beam wafer inspection apparatus having inspection performance for the wafer outer circumferential portion equivalent to that for the wafer center portion and an electron beam wafer inspection method having inspection performance for the wafer outer circumferential portion equivalent to that for the wafer center portion. Since an inspectable region of the wafer outer circumferential portion is enlarged, it is possible to contribute to improvement of yield of semiconductor device manufacturing.

DESCRIPTION OF EMBODIMENTS

Specific configuration examples of the present invention are explained below with reference to the drawings.

(First Embodiment)

In a first embodiment, a charged particle beam apparatus that changes a wafer holder according to a wafer to realize a function of changing a sample cover according to the wafer is explained. The charged particle beam apparatus according to this embodiment is an inspection apparatus employing a scanning electron microscope (SEM). First of all, a hardware configuration of the charged particle beam apparatus according to this embodiment is explained using FIGS. 1 to 3.

Figure 1:
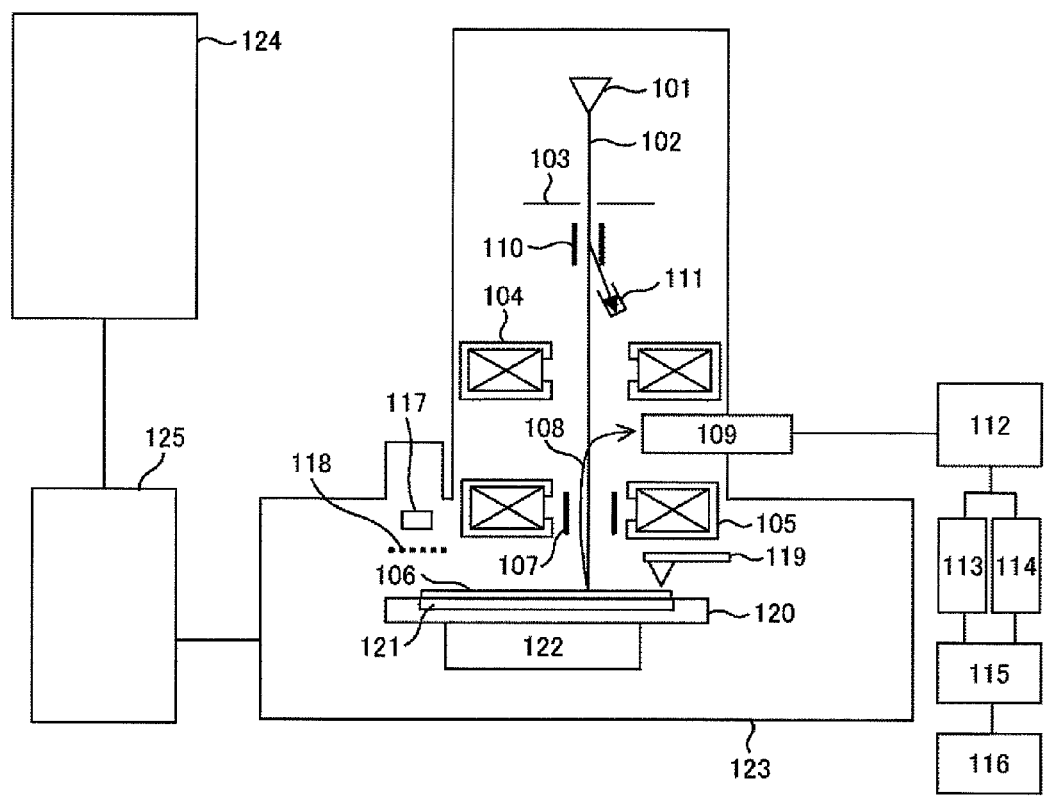
FIG. 1 is a diagram showing an internal configuration of a charged particle column and a vacuum sample chamber of a charged particle beam inspection apparatus according to a first embodiment.

First, an internal configuration of a scanning electron microscope unit is explained using FIG. 1. In the figure, only main components are shown. A stage driving unit, a vacuum pumping system, a load-lock chamber, an operation unit, and the like are omitted.

A primary electron beam 102 is emitted from an electron gun for SEM 101. The electron beam is focused by a beam limiting aperture 103 and one or plural focusing lenses 104. The primary electron beam 102 is focused on a wafer 106 by an object lens 105 and scanned in a first region by a deflector 107. As a result, signal electrons 108 including both or one of secondary electrons generated from the wafer and reflection electrons are detected by a signal electron detector 109. The primary electron beam 102 is deflected by a blanker 110 according to necessity and retracts from the wafer. At this point, the electron beam 102 is irradiated in a Faraday cup 111. A current amount of the primary electron beam 102 can be measured. The signal electron detector 109 converts the detected signal electrons 108 into an electric signal of an amount corresponding to the number or energy of the signal electrons 108 and transfers the electric signal to a signal processing unit 112. The electric signal is converted into a first image by the signal processing unit 112 and stored in a first image memory 113. Similarly, a second image is formed by signal electrons generated from a second region and is stored in a second image memory 114. The first image and the second image are compared by a comparative operation unit 115 and a difference image is formed. A defect determining unit 116 determines, from the difference image, whether there is a defect. An electron source for preliminary charging 117 is provided separately from the electron gun for SEM 101 and includes a control electrode 118 between the electron source 117 and the wafer 106. The surface potential of the wafer 106 is measured by a surface potential meter 119. The wafer 106 is retained on an electrostatic chuck plate 121 arranged on the wafer holder 120 and is moved by a moving stage 122. A range of movement is set such that the primary electron beam 102 can be irradiated on the entire region in the wafer 106 and an electron beam from the electron source for preliminary charging 117 can be irradiated on the entire region in the wafer 106. A region where an electron beam passes is sealed by a vacuum container 123 and a high vacuum is maintained by a vacuum pumping system. A central control unit 124 issues a command to the scanning electron microscope unit explained above. The scanning electron microscope unit is controlled according to an electronic signal supplied from a control power supply 125. In the figure, a configuration in which the primary electron beam 102 and the electron source for preliminary charging 117 irradiate electrons on portions different from each other. However, the effects of the present invention do not change at all in a configuration for irradiating the same place.

Figure 2:
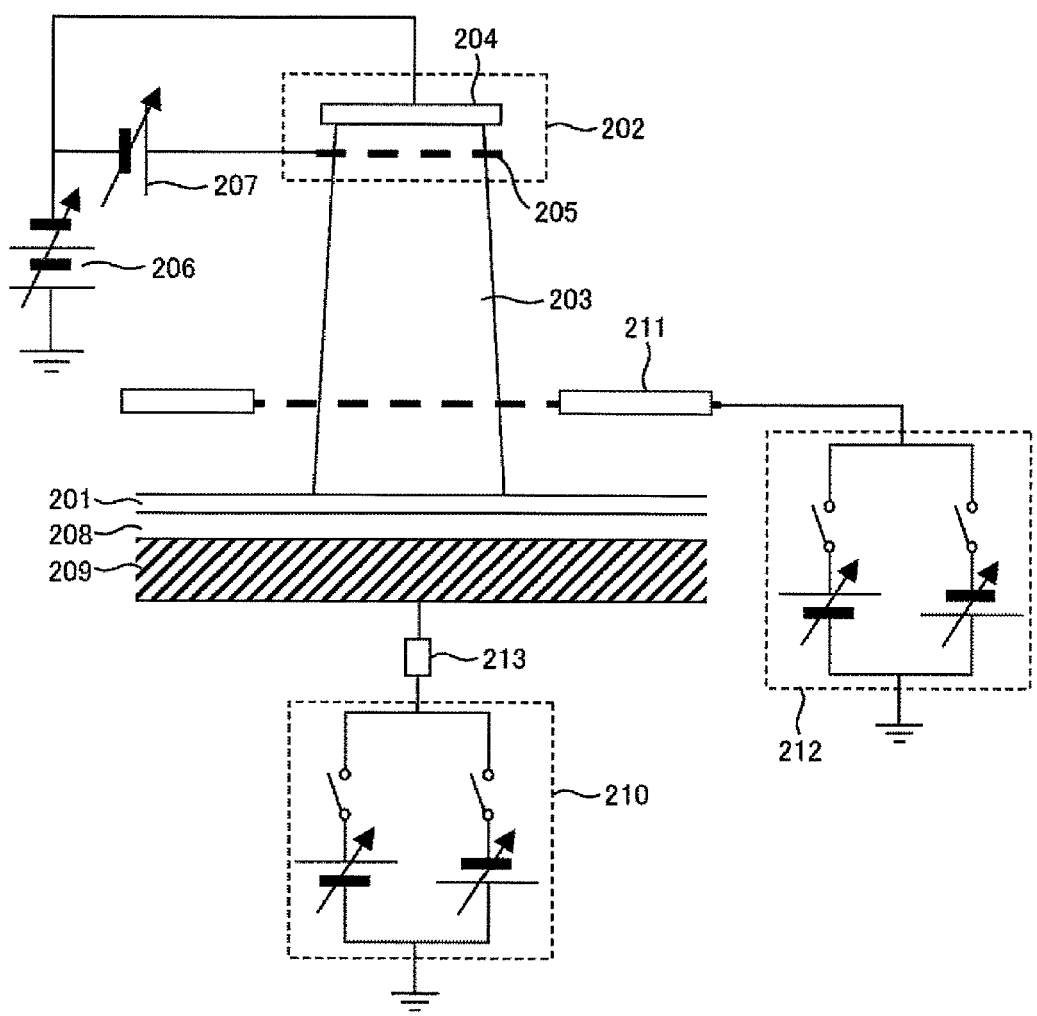
FIG. 2 is a diagram showing an internal configuration of a preliminary charging apparatus of the charged particle beam inspection apparatus according to the first embodiment.

The charged particle beam apparatus according to this embodiment includes, on a conveying path to a sample chamber of a wafer, a preliminary charging mechanism for charging the wafer. In FIG. 2, details of the preliminary charging mechanism are shown. A planar electron beam 203 is extracted from an electron source for preliminary charging 202 arranged above the wafer 201. The planar electron beam is formed because a focus mechanism by an electron lens is absent. The electron beam 203 has a spread of about 10 mm to 30 mm on the wafer 201. The electron source 202 shown in FIG. 2 includes a cathode 204 and a grid 205. A cathode voltage supplied from a cathode power supply 206 decides acceleration of the electron beam 203. A grid voltage supplied from a grid power supply 207 decides a current amount of the electron beam 203. Energy of the electron beam 203 on the wafer 201 (hereinafter, irradiation energy) is decided by a difference between a holder voltage and a cathode voltage applied from a power supply for wafer holder 210 to a wafer holder 209 mounted with an electrostatic chuck plate 208 that retains the wafer 201. The irradiation energy can be adjusted between 0 eV to 5 keV. A control electrode 211 is arranged between the electron source for preliminary charging 202 and the wafer 201. A control electrode voltage (hereinafter, control voltage) supplied from a control electrode power supply 212 is applied to the control electrode 211. The control voltage can take both positive and negative polarities with respect to the wafer 201. The magnitude of the control voltage can be changed. An amount of an electric current made incident on the wafer 201 is measured by an absorption current meter 213.

Figure 3:
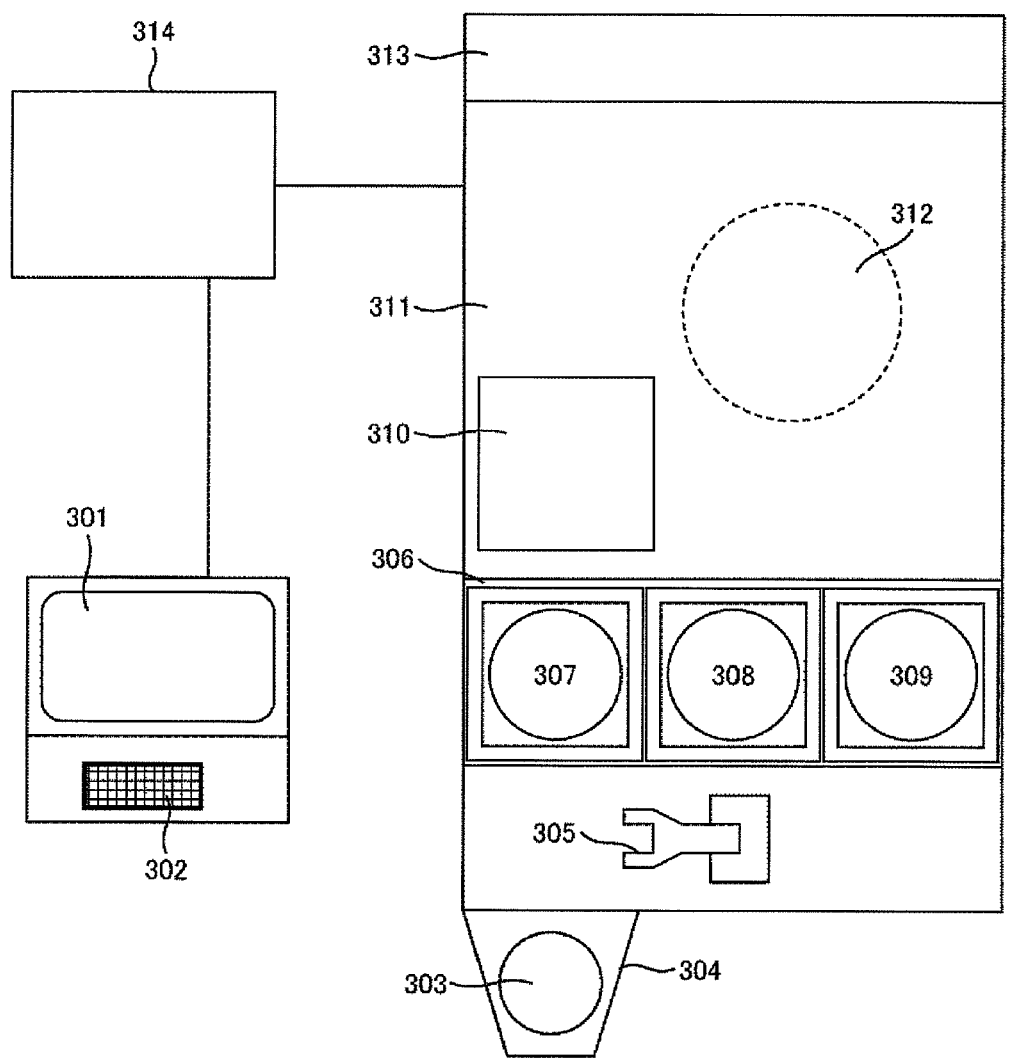
FIG. 3 is a top view showing an overall configuration of the charged particle beam inspection apparatus according to the first embodiment.

A top view of the entire configuration of the charged particle beam apparatus according to this embodiment is shown in FIG. 3. A wafer pod 304 in which a wafer 303 to be inspected is stored is attached to the charged particle beam apparatus according to this embodiment. The wafer 303 is taken out from the wafer pod 304 by a conveying arm 305 and carried into a load-lock chamber 306. Plural wafer holders are arranged in the load-lock chamber 306. In FIG. 3, a configuration including three holders: a first sample holder (a wafer holder A) 307 including a first sample cover, a second sample holder (a wafer holder B) 308 including a second sample cover, and a third sample holder (a wafer holder C) 309 including a third sample cover is shown. In the charged particle beam apparatus according to this embodiment, an operation screen 301 and an operation keyboard 302 for an operator to input various control conditions are provided. The apparatus has a function of automatically selecting one (assumed to be 307) of the wafer holders according to the set conditions. Details are explained later.

When the wafer holder to which the wafer is conveyed is determined, the wafer 303 is transferred onto the wafer holder 307 by the conveying arm 305 and moves to a sample chamber 311 after preliminary pumping. In the sample chamber 311, the wafer 303 is held by the wafer holder 307. The wafer holder 307 is held by a sample stage 310. On the sample chamber 311, a charged particle column 312 including a function of irradiating a primary charged particle beam on a sample to be inspected and detecting secondary charged particles generated by the irradiation as a secondary charged particle signal is provided. In this embodiment, the charged particle column 312 is a SEM lens barrel. The wafer 303 is subjected to image acquisition under the charged particle column 312. Defect inspection is performed by an image processing device 313. In the image processing device 313, the comparative operation unit 115 and the defect determining unit 116 shown in FIG. 1 is implemented as functions. In some case, the comparative operation unit 115 and the defect determining unit 116 are implemented as hardware (processors for the comparative operation unit and the defect determining unit are independently provided) and, in other cases, the comparative operation unit 115 and the defect determining unit 116 are implemented as software (a general-purpose processor is provided and caused to execute a program for the comparative operation unit and a program for the defect determining unit). An apparatus operator sends an instruction to a central control unit 314 via the operation screen 301 and the keyboard 302, whereby the operation of the charged particle beam apparatus is controlled. Alternatively, the central control unit 314 controls the apparatus according to a program stored in advance.

Figure 4:
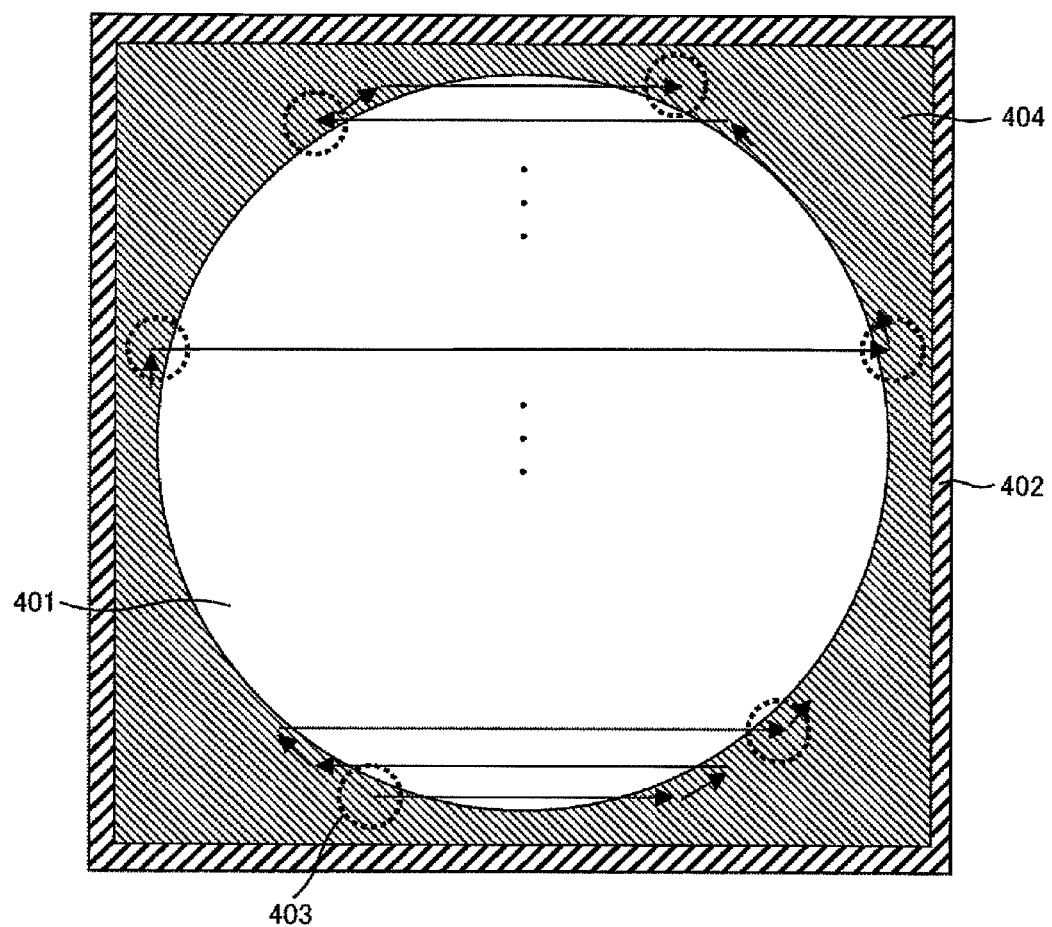
FIG. 4 is a top view showing the arrangement of a sample cover on a wafer holder.

The movement of the moving stage in the case of execution of preliminary charging is shown in FIG. 4. In the figure, it is shown that a wafer does not move and a preliminary charging beam moves on the wafer. However, in this embodiment, it is considered that the wafer is moved by the moving stage with respect to a fixed preliminary charging beam. A wafer 401 is held by a wafer holder 402 and moves under irradiation spots 403 of the preliminary charging beam in the order of arrows. A member 404 is a sample cover and explained in FIG. 5 in detail. The size of the sample cover 404 is sufficient if the size is about the spread of the irradiation spots 403 of the preliminary charging beam. Since this member plays a role equivalent to the wafer during the preliminary charging, the preliminary charging of the wafer outer circumferential portion is equivalent to that in the wafer center portion.

Figure 5:
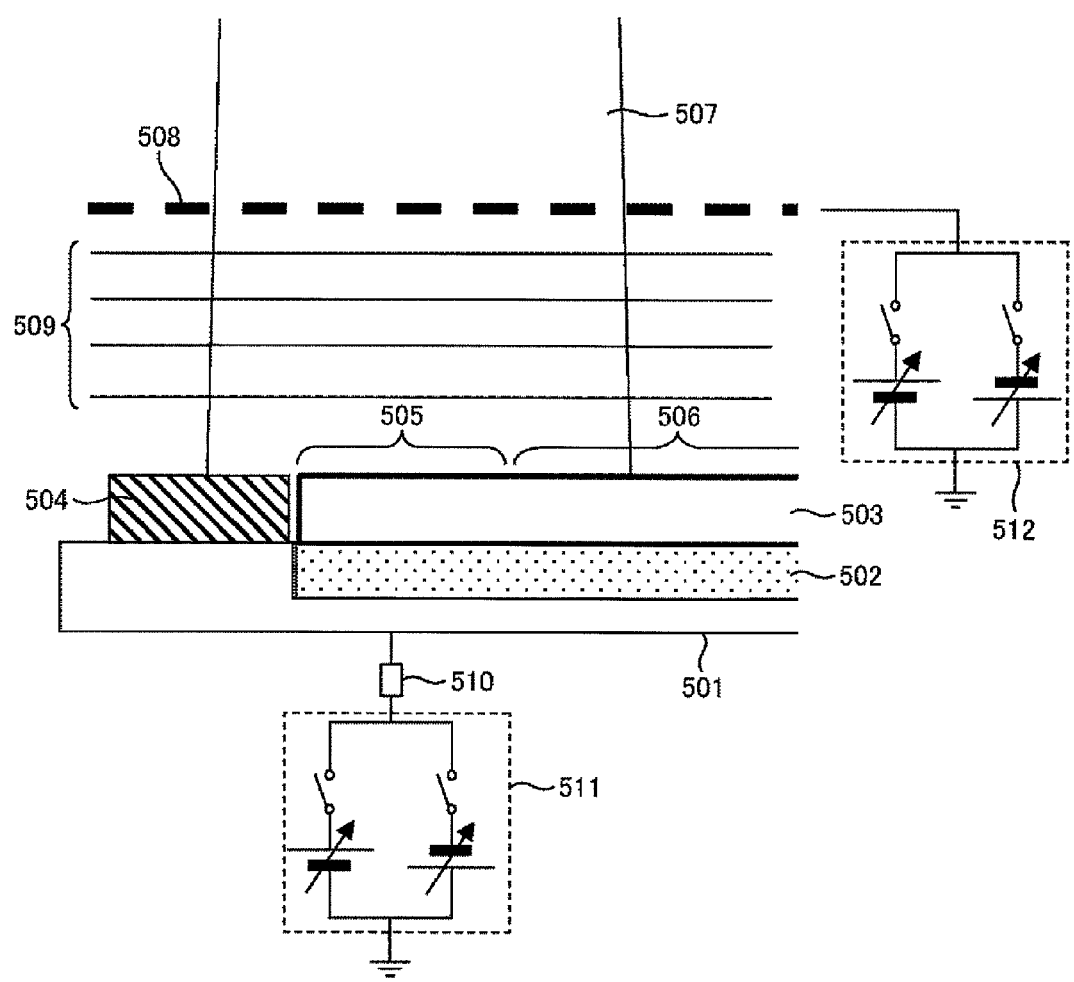
FIG. 5 is a diagram showing an effect of the charged particle beam inspection apparatus according to the first embodiment.

In FIG. 5, a cross section of the circumferential portion and the center portion of a wafer and the wafer holder is schematically shown. An electrostatic chuck plate 502 is fixed to the wafer holder 501. A wafer 503 is held on the electrostatic chuck plate 502. A sample cover 504 having appropriate capacitance and electric resistance is arranged on the outer side of the wafer 503. In this embodiment, it is assumed that a material tested in advance to have charging characteristics substantially equal to those of the wafer is used as the material of the sample cover. It is assumed that the material of the sample cover is different among the sample holders 307 to 309 shown in FIG. 3. Any material may be used as the material of the sample cover. However, silicon that is the material of the wafer is often used. However, in order to appropriately adjust electric resistance and capacitance according to the wafer, impurities such as metal, oxide, or nitride are added. Besides adding an impurity element, a film of an appropriate element may be formed on silicon. Alternatively, a member obtained by forming patterns of lines and spaces, plugs, and the like same as those of the wafer on silicon may be used as the sample cover. It goes without saying that silicon alone may be used as the material of the sample cover as long as target charging characteristics can be obtained.

When a wafer outer circumferential portion 505 is preliminarily charged, the sample cover 504 is preliminarily charged such that a preliminary charging beam 507 is irradiated on the sample cover 504 as well. As shown in FIG. 2, a power supply for control electrode 512 is connected to a control electrode 508 and a power supply for wafer holder 511 is connected to the wafer holder 501. The wafer holder and the sample cover electrically have the same potential. An electric current flowing into the wafer holder as a result of the irradiation of the preliminary charging beam 507 (an absorption current) is measured by an absorption current meter 510. The charging characteristics of the sample cover 504 are substantially equal to those of the wafer and the potential applied to the sample cover is equal to the potential applied to the wafer holder. Therefore, in the sample cover 504, a charging voltage about the same as that of the wafer 503 is generated by the preliminary charging beam 507. The charging voltage changes following the progress of the charging of the wafer. Consequently, a potential distribution 509 formed on the wafer is substantially uniform in the wafer outer circumferential portion and the center portion. Therefore, it is possible to obtain the same charging voltage in the wafer outer circumferential portion 505 and a wafer center portion 506.

The number of wafer holders that the apparatus should include is not limited. However, the wafer holders are prepared as many as possible to be able to cope with the material and the process of the wafer. For example, for a wafer in which the thickness of an insulating film is large and a wafer in a process in which the conductivity of a circuit pattern formed on the surface is high, a member having large resistance only has to be selected. For a wafer in which the thickness of an insulating film is small and a wafer in a process in which the conductivity of a circuit pattern formed on the surface is low, a member having small resistance only has to be selected.

Figure 6:
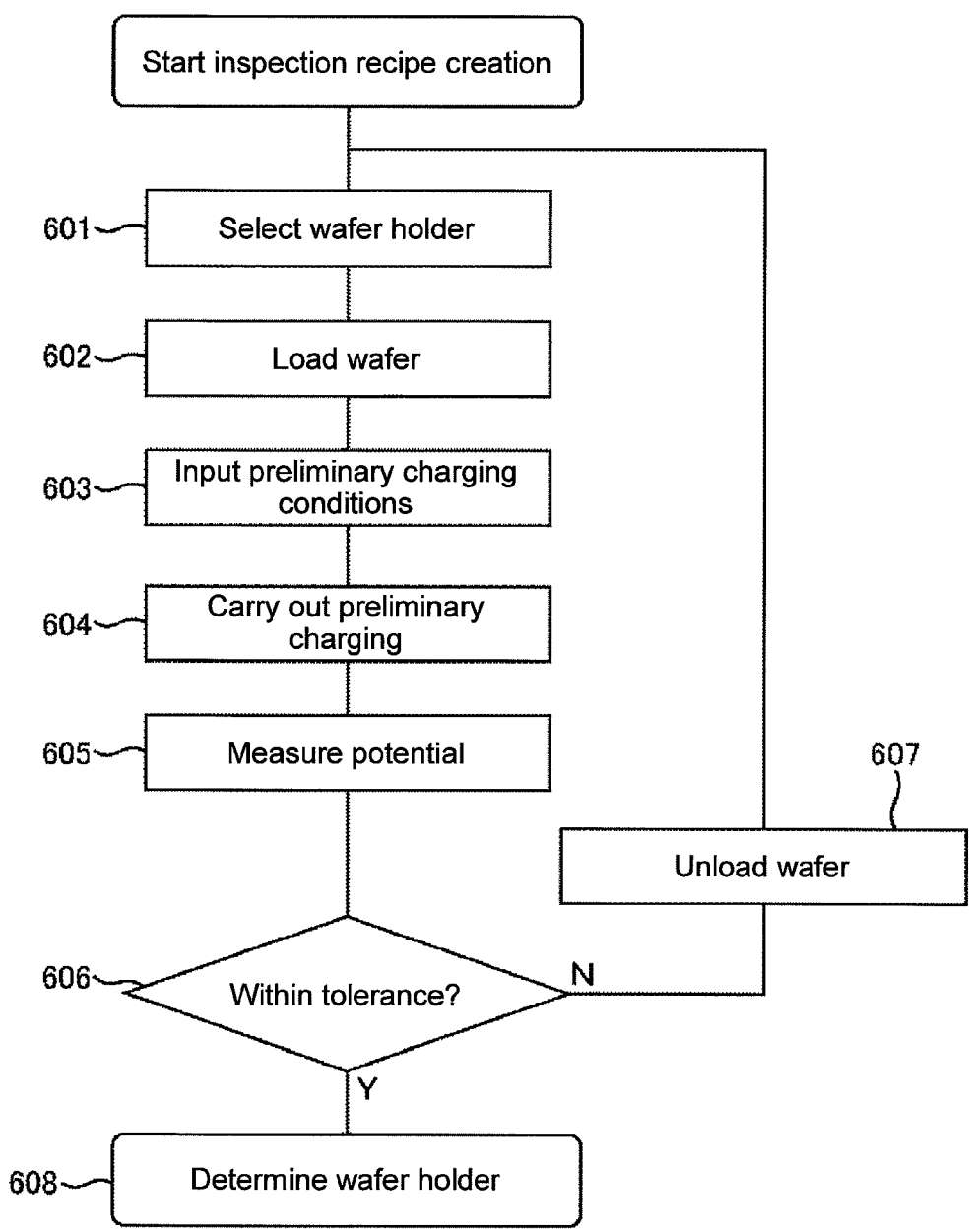
FIG. 6 is a configuration example of a wafer holder selection flow of the charged particle beam inspection apparatus according to the first embodiment.

A method of selecting an appropriate wafer holder is explained. This method is included in a creation procedure for an inspection recipe. A flow of the method is shown in FIG. 6. A wafer holder in use is appropriately selected according to the process and the material of a wafer to be inspected. Propriety of the selection is determined on the basis of variation in a wafer surface of charging potential or an absorption current. As explained with reference to FIG. 3, the charged particle beam apparatus according to this embodiment includes plural kinds of wafer holders. In this embodiment, it is assumed that an initial value of wafer holder selection is set to a wafer holder A.

When a selection screen for a wafer holder is invoked halfway in setting of an inspection recipe, a selection step for a wafer holder shown in step 601 of FIG. 6 is executed. Usually, the apparatus automatically sets this work on the basis of information such as a plug and a wiring material on a wafer input on a recipe setting screen. However, in some case, the apparatus operator manually inputs the work. It is assumed that, as a result of the setting, the wafer holder A is selected. In step 602, a wafer is loaded on the wafer holder A. In step 603, preliminary charging conditions such as an irradiation current amount, a control voltage, a preliminary charging range, continuous moving speed of the stage, and a continuous moving path of the stage are input. Preliminary charging is carried out in step 604. The instruction and the input in steps 602, 603, and 604 are performed by the apparatus operator via the operation screen 301 and the keyboard 302. However, in some case, the central control unit 314 automatically performs the instruction and the input according to a program set beforehand.

After the end of the preliminary charging, in step 605, the central control unit 314 acquires a charging voltage distribution in the wafer using a surface potential meter. A method of acquiring the distribution is not limited if the method is a method for learning the voltage of the wafer surface other than a method of using the surface potential meter 119. A voltage distribution in the wafer may be several points if the points include the wafer outer circumferential portion or may be one point of the wafer outer circumferential portion if the charging voltage of the wafer center portion is known. It is assumed that, as a result of performing this distribution measurement, deviation between the charging voltage of the wafer outer circumferential portion and the charging voltage of the wafer center portion is larger than a separately-set tolerance. In this case, the central control unit 314 determines in the determination in step 606 that charging of the wafer outer circumference is not optimum. In step 607, the central control unit 314 carries the wafer to the outside of the apparatus. The apparatus operator selects a wafer holder in step 601 again. It is assumed that the apparatus operator selects the wafer holder B. If the deviation falls within the tolerance as a result of performing the preliminary charging and the distribution measurement again through steps 602, 603, 604, and 605, the central control unit 314 determines in the determination in step 606 that charging of the wafer outer circumferential portion is optimum. The central control unit 314 determines that the wafer holder B is an appropriate holder (step 608). When wafers in different processes are inspected, as a result of carrying out the selection method, the wafer holder C could be selected. When the deviation does not fall within the tolerance in all the wafer holders, the central control unit 314 determines that an error occurs and ends the recipe creation work.

Figure 7:
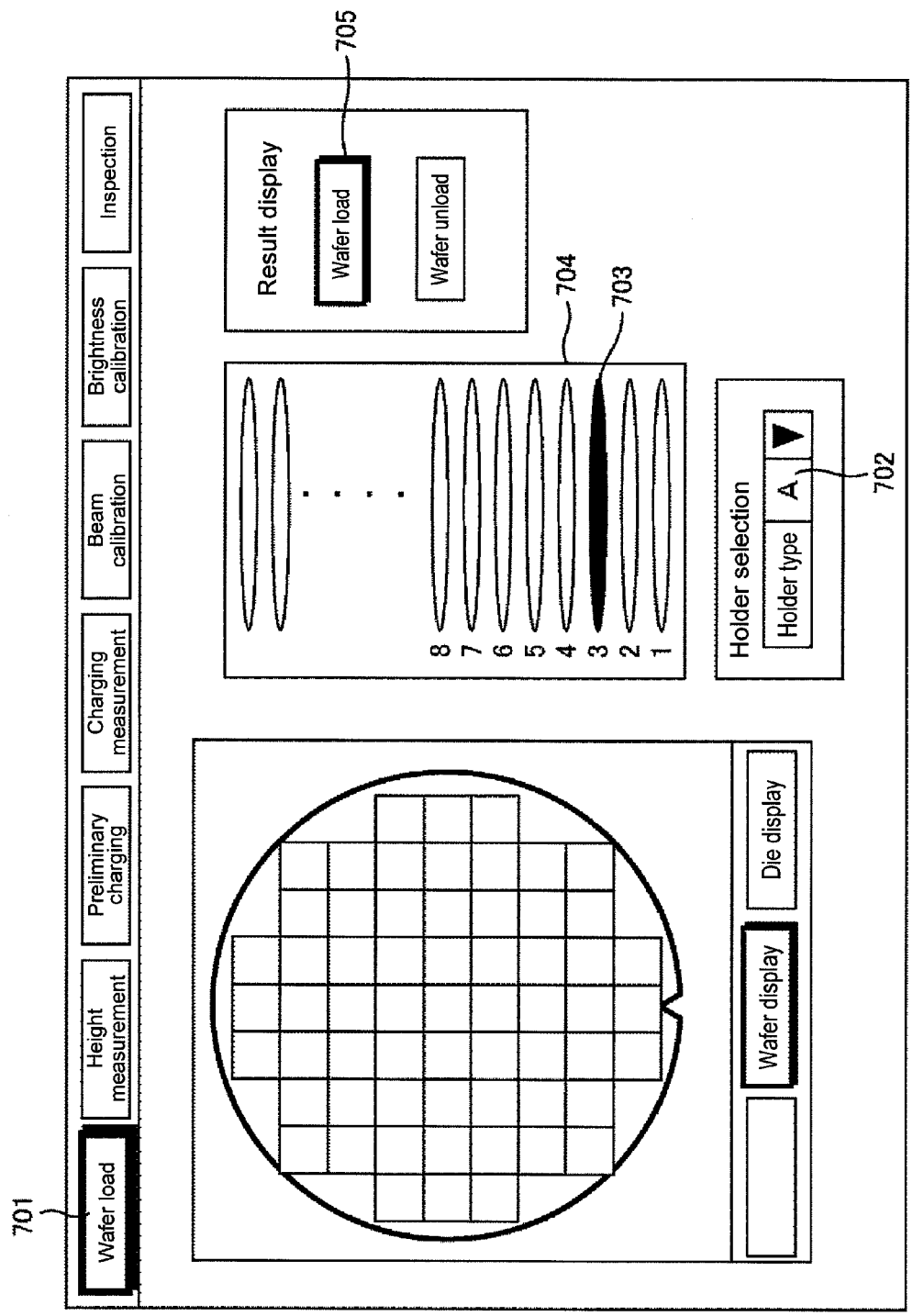
FIG. 7 is an example of an operation screen for selecting a sample holder of the charged particle beam inspection apparatus according to the first embodiment.

An example of a screen displayed on the operation screen 301 when a wafer holder is manually set in step 601 is shown in FIG. 7. After selecting a wafer load tab 701 of the operation screen, the operator selects the wafer holder A from a pull-down menu 702 for setting a holder type. The operator selects, from a wafer pod 704, a wafer 703 to be inspected and presses a wafer load button 705. Set information is transmitted to the central control unit 124 shown in FIG. 1.

Figure 8:
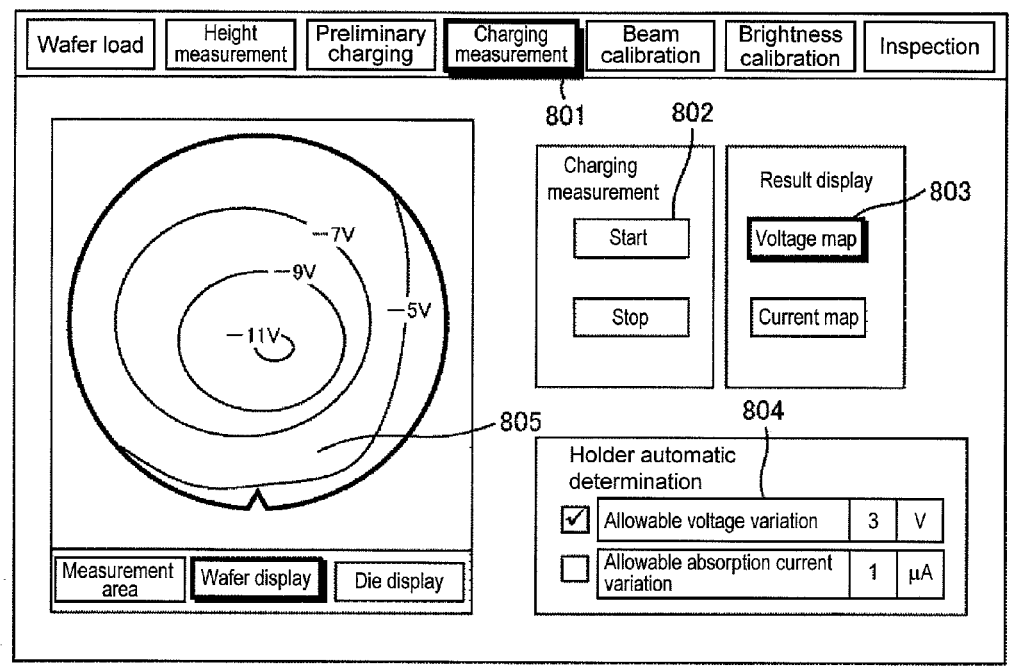
FIGS. 8(a) and (b) are examples of a charging map display screen of the charged particle beam inspection apparatus according to the first embodiment.
Figure 8:
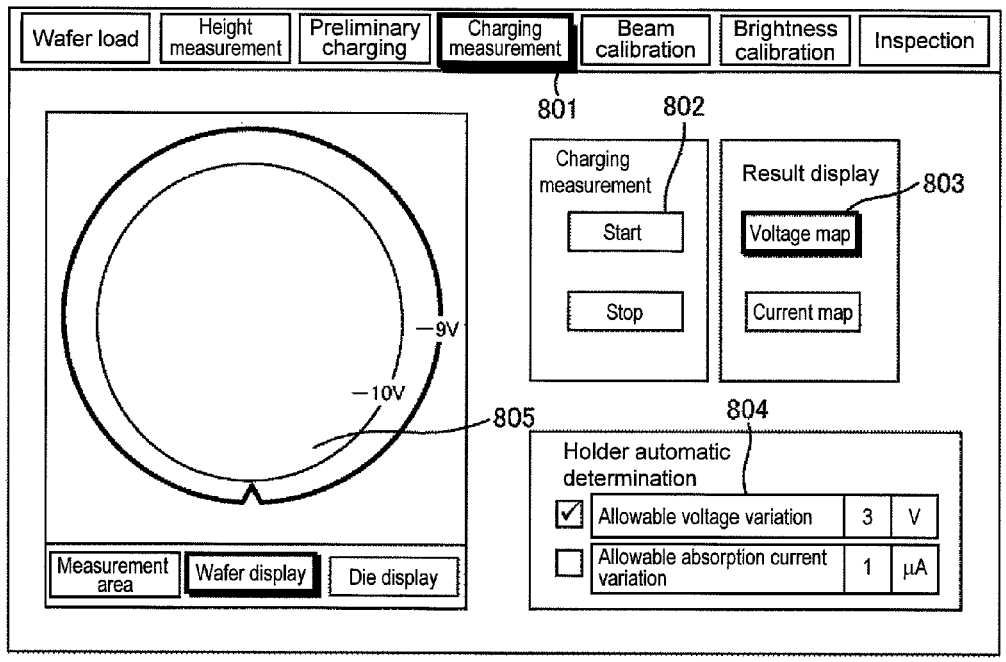

In FIGS. 8(a) and (b), an example of a screen displayed on the operation screen 301 during execution of the potential measurement in step 605 is shown. FIG. 8(a) represents a case in which the deviation between the charging voltage of the wafer outer circumferential portion and the charging voltage of the wafer center portion is larger than the tolerance. FIG. 8(b) represents a case in which the deviation between the charging voltage of the wafer outer circumferential portion and the charging voltage of the wafer center portion is smaller than the tolerance. After the preliminary charging in step 604 is carried out, the operation screen shifts to a screen (a screen indicated by a charging measurement tab 801) shown in FIG. 8(a) or FIG. 8(b). At this point, nothing is displayed on a charging map 805. The operator designates, with parameter setting means 804 for setting a reference parameter for holder automatic determination, that voltage variation is set as a reference. The operator inputs an allowable voltage in advance. In FIG. 8, the allowable voltage is set to 3 V. Subsequently, the operator presses a start button 802 from a start button/a stop button for charging measurement and starts charging voltage measurement in the wafer.

After the measurement ends, when the operator selects a voltage map display button from a result display button 803 and presses the voltage map display button, an equipotential line indicating a charging voltage in the wafer is displayed on the map 805 on the left side. In the case of FIG. 8(a), since variation in the wafer surface of the charging voltage is larger than the set allowable voltage 3.0 V, the central control unit 314 determines in step 606 in FIG. 6 that the wafer holder is inappropriate. The wafer is unloaded and another wafer holder is selected. When a measurement result falls within the allowable voltage variation as shown in FIG. 8(b), it is determined that the wafer holder is appropriate and the selection flow for a wafer holder ends. Consequently, a holder in use in this recipe is determined and the central control unit 314 proceeds to the next recipe creation flow.

Next, a flow in the case in which an absorption current is set as a reference parameter for holder automatic determination in step 605 of FIG. 6 is explained.

Figure 9:
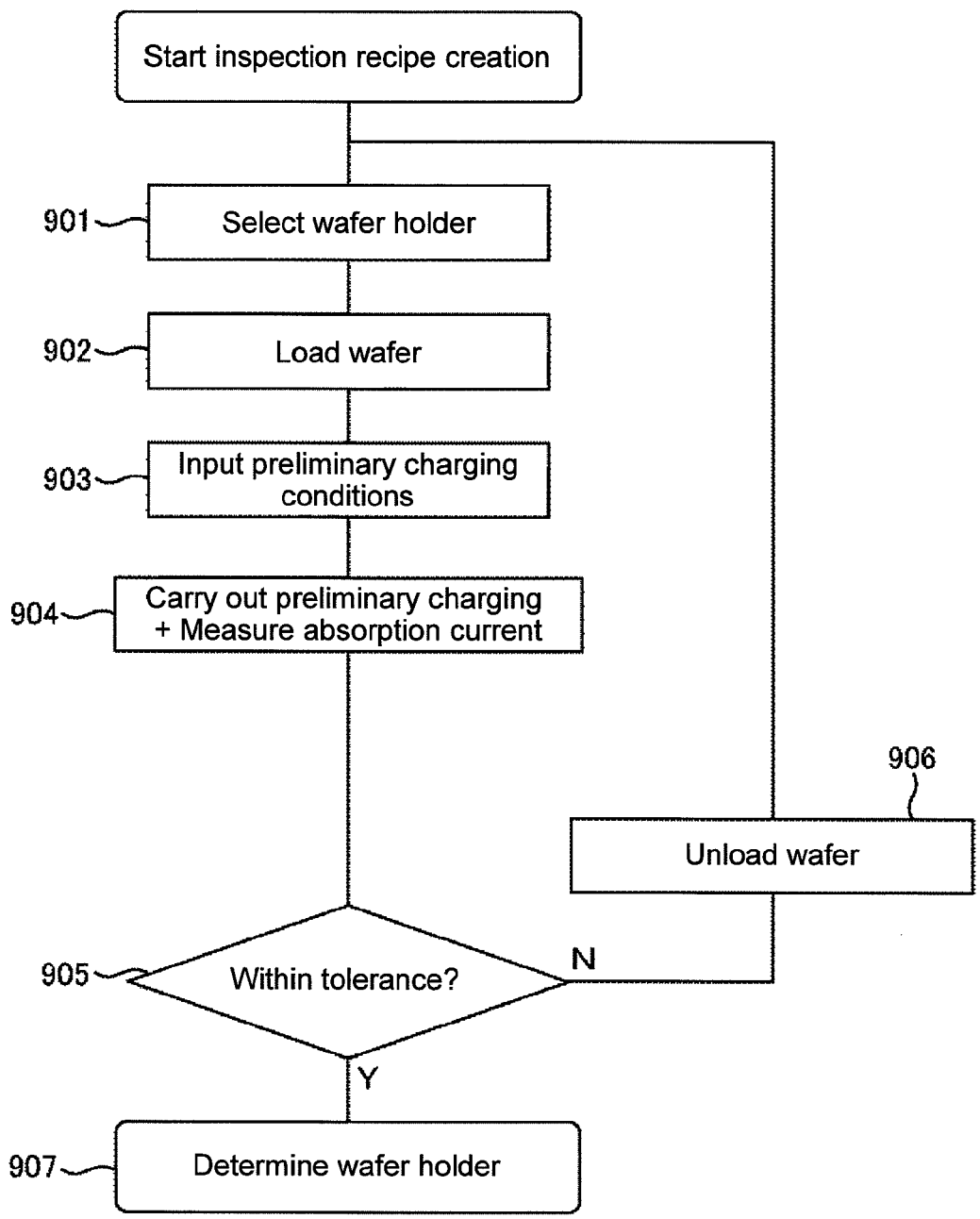
FIG. 9 is a configuration example of a wafer holder selection flow of the charged particle beam inspection apparatus according to the first embodiment.

It is assumed that the selection screen for a wafer holder is invoked halfway in setting of an inspection recipe and a wafer holder selection flow shown in FIG. 9 is invoked. It is assumed that the operator selects the wafer holder A in step 901. A method of selecting a wafer holder conforms to FIG. 7. In step 902, the operator loads a wafer using the wafer holder A. In step 903, the operator inputs preliminary charging conditions such as an irradiation current amount, a control voltage, a preliminary charging range, continuous moving speed of the stage, and a continuous moving path of the stage. In step 904, the operator carries out preliminary charging and stores an absorption current value during pre-charge. After the end of the preliminary charging, in step 905, the central control unit 314 compares the magnitude of variation of a measured absorption current and the magnitude of a separately-set tolerance. It is assumed that the variation of the absorption current is larger than the tolerance. In this case, the central control unit 314 determines in the determination in step 905 that charging of the wafer outer circumferential portion is not optimum. In step 906, the central control unit 314 carries the wafer to the outside of the apparatus. In step 901, the operator selects a wafer holder again. It is assumed that the operator selects the wafer holder B. If variation falls within the tolerance as a result of re-determination through steps 902, 903, and 904, the central control unit 314 determines in the determination in step 905 that charging of the wafer outer circumferential portion is optimum and determines that the wafer holder B is an appropriate holder (step 907).

Figure 10:
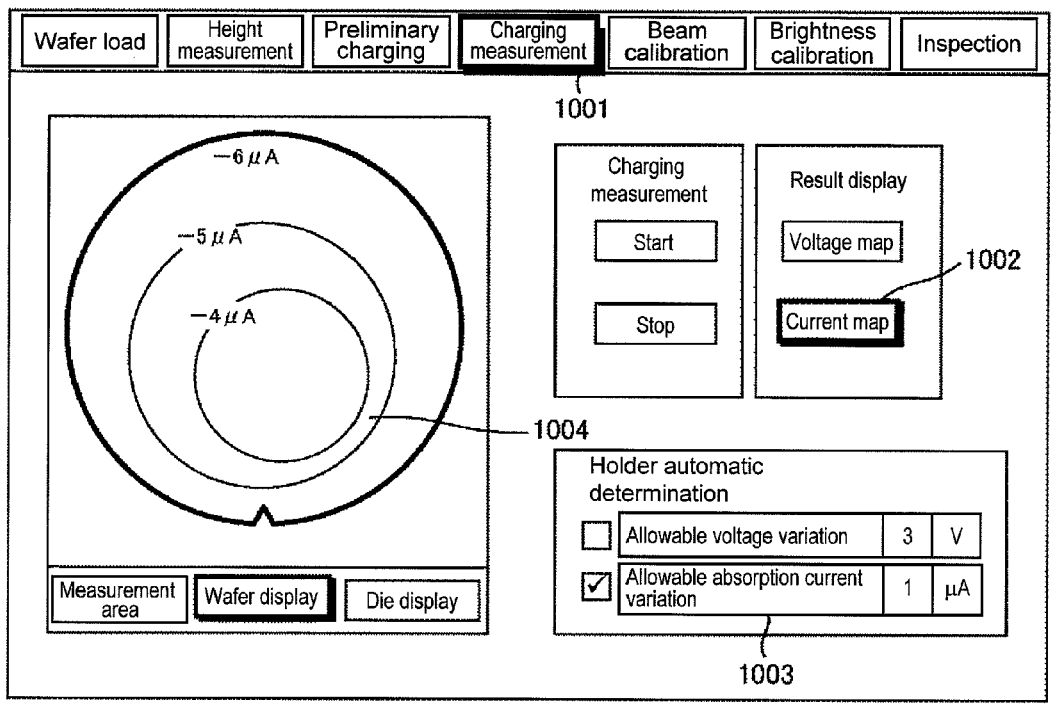
FIGS. 10(a) and (b) are examples of an absorption current map display screen of the charged particle beam inspection apparatus according to the first embodiment.
Figure 10:
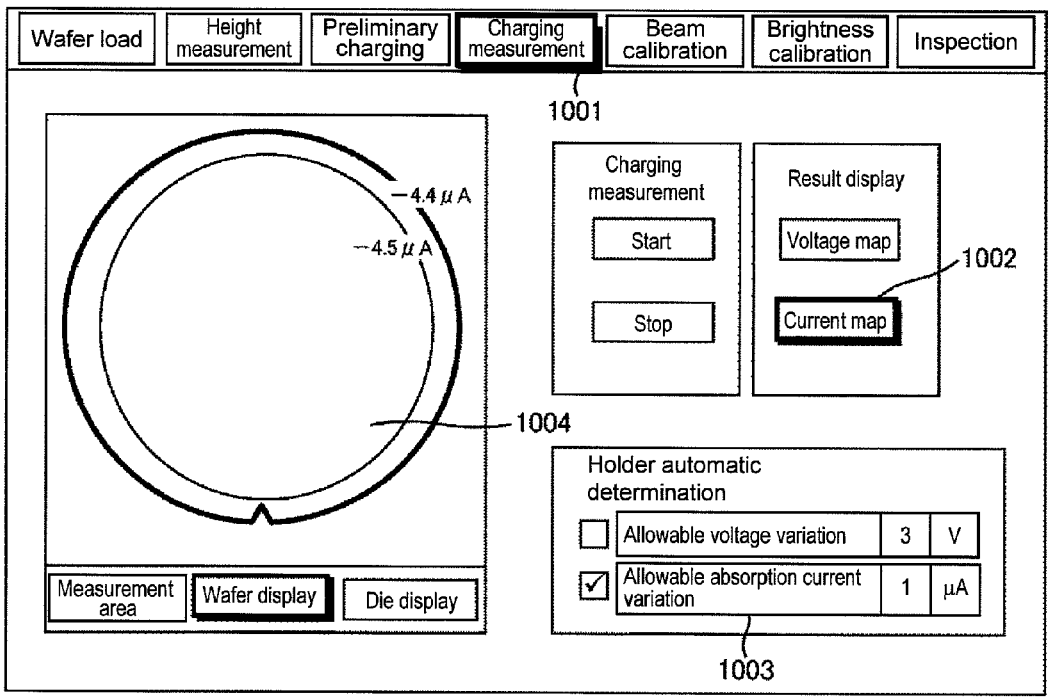

An operation screen for performing determination of absorption current variation is shown in FIG. 10. FIG. 10(*a*) represents a case in which variation of an absorption current is larger than the tolerance. FIG. 10(*b*) represents a case in which variation of an absorption current is smaller than the tolerance. After carrying out the preliminary charting, the operator selects a charging measurement tab 1001. The operator designates in 1003 that absorption current variation is set as a holder determination reference and inputs allowable current variation in advance. In FIG. 8, the allowable current variation is set to 1 µA. When the operator presses a current map display button 1002, a figure showing an absorption current distribution in the wafer is displayed on a map 1004 on the left side. When a measurement result varies equal to or larger than the allowable current variation as shown in FIG. 10(*a*), the central control unit 314 determines that the wafer holder is inappropriate and unloads the wafer the operator selects another wafer holder. When the measurement result falls within the allowable current variation as shown in FIG. 10(*b*), the central control unit 314 determines that the wafer holder is appropriate, determines a holder in use in this recipe, and proceeds to the next recipe creation flow.

The absorption current value is an amount that reflects a charged state to some extend rather than wafer charging itself. Therefore, originally, the method of using charging potential for determination explained with reference to FIG. 8 is desirable. However, there are two advantages explained below. One is an advantage that measurement not depending on relaxation with time of a charged state can be performed. In the case of a wafer having large relaxation with time of surface potential after the preliminary charging, a voltage fluctuates during the charging potential measurement in step 605 and an accurate charging map cannot be acquired. Since the absorption current value is a value at an instance when the preliminary charging is performed and does not depend on the relaxation with time, it is possible to acquire an accurate charging map that reflects a charged state during the preliminary charging. The other is an advantage that time until wafer holder determination is reduced compared with the case in which a charging voltage is measured. When charging potential is measured, time is required for the execution of step 605 in FIGS. 6 to 8. On the other hand, since the absorption current measurement can be executed simultaneously with the preliminary charging, it is unnecessary to divide the preliminary charging step and the measurement step for a charged state. Further, measurement time is extremely short because the measurement is current measurement. Therefore, the time until wafer holder determination is reduced. Since the charged particle beam apparatus according to this embodiment includes both the determining means, it is possible to properly use two modes: a recipe setting mode that attaches importance to accuracy (a wafer holder is determined by measuring charging potential) and a recipe setting mode that can cope with a wafer having a large change with time of a charged state (a wafer holder is determined by measuring an absorption current).

The above explanation is made using the charged particle beam apparatus including the preliminary charging mechanism. However, since the sample cover and the wafer holder are integrally conveyed into the sample chamber, the charging control mechanism according to this embodiment can also be applied to a charged particle beam apparatus that performs charging control using a primary charged particle beam for inspection image acquisition. The charging control method according to this embodiment can also be applied to an inspection apparatus employing an ion beam processing unit or a helium ion microscope. Further, the charging control method can be applied to not only the wafer inspection apparatus but also a measuring apparatus and an observation apparatus employing a charged particle beam microscope. A charged particle beam apparatus having, in the wafer outer circumferential portion, inspection performance and observation performance equivalent to those in the wafer center portion is realized by the charging control mechanism according to this embodiment.

(Second Embodiment)

In the first embodiment, the charged particle beam apparatus that determines propriety of a wafer holder using a measured value of charging potential or an absorption current is explained. In a second embodiment, a charged particle beam apparatus including a function of determining a wafer holder using a charged particle beam image after preliminary charging is explained. Since a hardware configuration of the apparatus according to this embodiment is substantially the same as the configuration explained in the first embodiment, explanation of the hardware configuration is omitted and only differences are explained.

Figure 11:
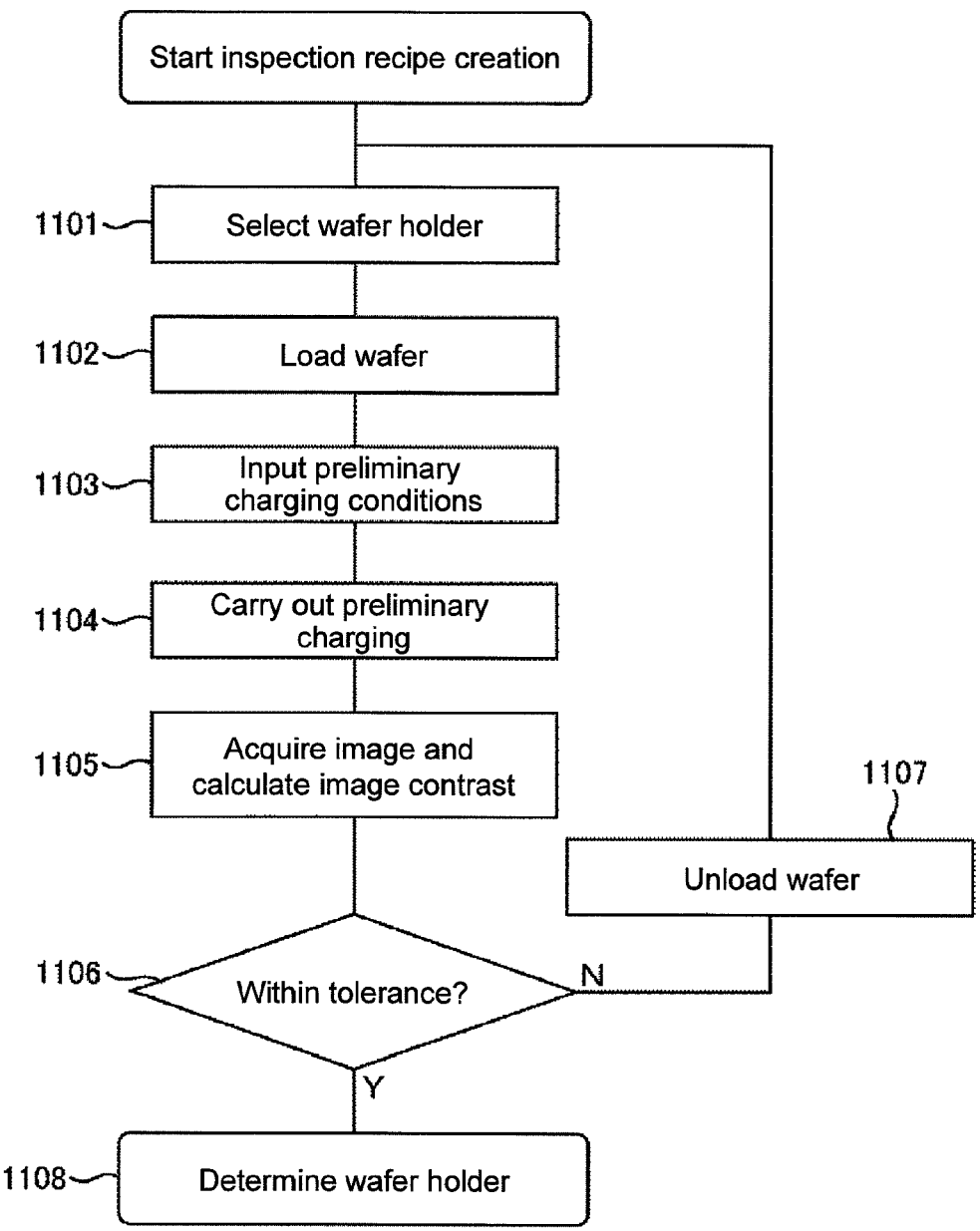
FIG. 11 is a configuration example of a wafer holder selection flow of a charged particle beam inspection apparatus according to a second embodiment.

The charged particle beam apparatus according to this embodiment compares image contrasts of the wafer center portion and the wafer outer circumferential portion and, if a difference is larger than a separately-set tolerance, changes a wafer holder. A flow of wafer holder determination is shown in FIG. 11. It is assumed that an apparatus operator selects the wafer holder A in step 1101. A method of selecting a wafer holder conforms to FIG. 7. The operator loads a wafer in step 1102 using the wafer holder A. In step 1103, the operator inputs preliminary charging conditions such as an irradiation current amount, a control voltage, a preliminary charging range, continuous moving speed of a stage, and a continuous moving path of the stage. In step 1104, the operator carries out preliminary charging.

After the end of the preliminary charging, in step 1105, the central control unit 124 acquires an SEM image along the radial direction of the wafer from the wafer outer circumferential portion to the center portion and calculates an image contrast. The image contrast is obtained by calculating a difference between average luminance of a characteristic first region and average luminance of a characteristic second region included in acquired one SEM image. In other words, the image contrast is a difference between luminances of portions in different two places in an acquired SEM image. The calculation is carried out by the central control unit 314 shown in FIG. 3.

A place where the image is acquired may be several points if the points include the wafer outer circumferential portion and the wafer center portion or may be one point of the wafer outer circumferential portion if an image of the wafer center portion is known. In step 1106, the central control unit 124 calculates variation of image contrasts of images acquired at several points. When an image is acquired only at one point, the central control unit 124 calculates a difference between an image contrast of the point and a contrast of the known image in the wafer center portion. The central control unit 124 compares the calculated variation or difference of the contrasts with a separately-set variation tolerance. It is assumed that the variation or the difference is larger than the tolerance. In this case, the central control unit 124 shown in FIG. 1 determines in the determination in step 1106 that charging of the wafer outer circumferential portion is not optimum. In step 1107, the central control unit 124 carries the wafer to the outside of the apparatus. In step 1101, the operator selects a wafer holder again.

It is assumed here that the operator selects the wafer holder B. If variation falls within the tolerance as a result of re-determination through steps 1102, 1103, 1104, and 1105, the central control unit 124 determines in the determination in step 1106 that charging of the wafer outer circumferential portion is optimum and determines that the wafer holder B is an appropriate holder (step 1108). As a determination reference based on an image, the brightness of the image (average luminance of all pixels included in the image) may be used instead of the contrasts.

Figure 12:
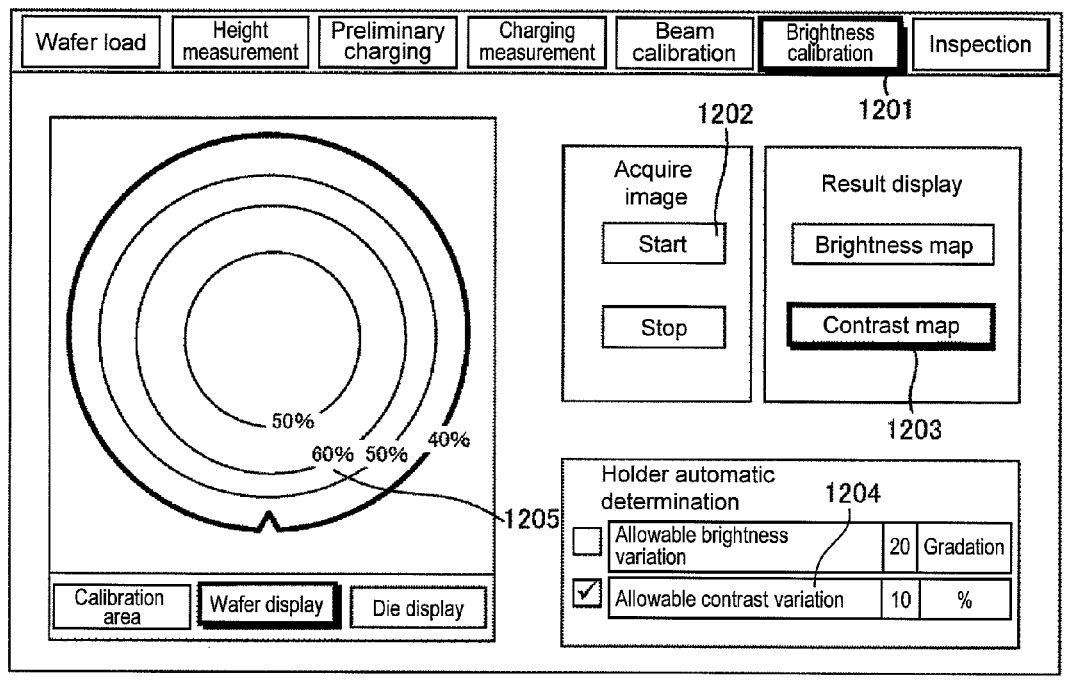
FIGS. 12(a) and (b) are examples of a contrast map display screen of the charged particle beam inspection apparatus according to the second embodiment.
Figure 12:
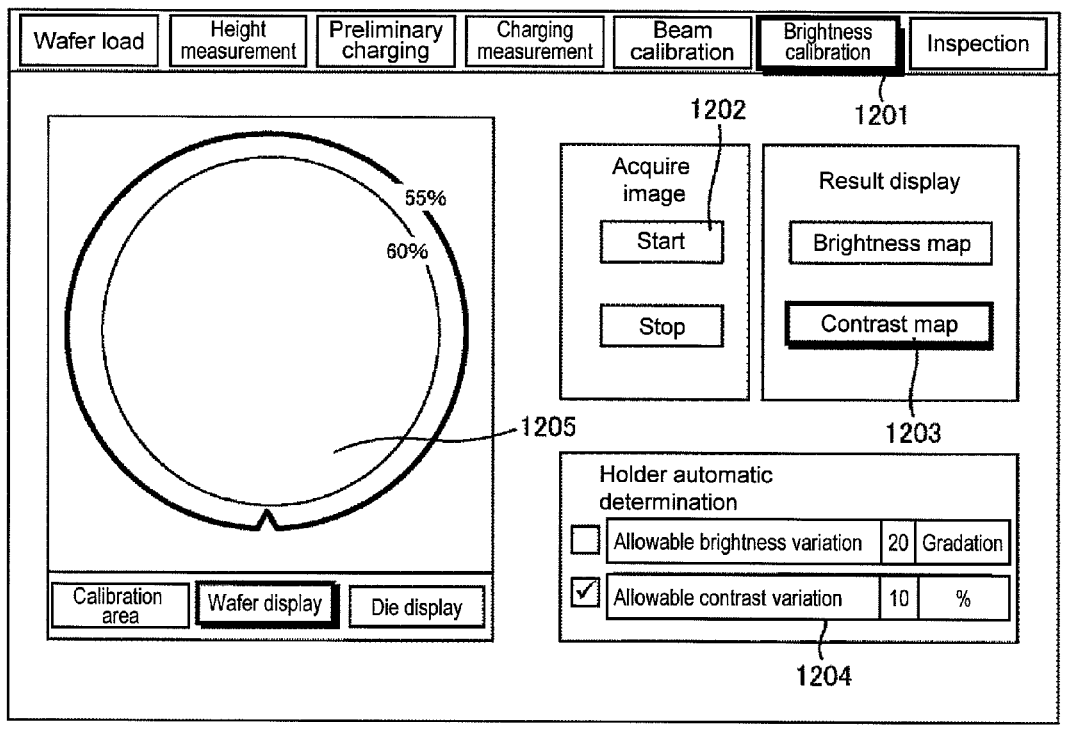

A screen displayed on the operation screen 301 in step 1105 of FIG. 11 is shown in FIG. 12. FIG. 12(*a*) represents a case in which the variation of the contrasts is larger than the tolerance. FIG. 12(*b*) represents a case in which the variation of the contrasts is smaller than the tolerance. After carrying out the preliminary charging, the operator selects a brightness calibration tab 1201. The operator designates in 1204 that the image contrast variation is set as a reference and inputs allowable contrast variation in advance. In FIG. 12, the allowable contrast variation is set to 10%. When the operator presses an image acquisition button 1202, acquisition of an SEM image is performed in the wafer surface. When the operator presses a contrast map display button 1203, an SEM image contrast distribution in the wafer is displayed on a map 1205 on the left side. When a measurement result varies equal to or larger than the allowable variation as shown in FIG. 12(*a*), the central control unit 124 determines that the wafer holder is inappropriate and unloads the wafer and the operator selects another wafer holder. When a measurement result falls within the allowable variation as shown in FIG. 12(*b*), the central control unit 124 determines that the wafer holder is appropriate, determines a holder in use in this recipe, and proceeds to the next recipe creation flow.

The charged particle beam apparatus according to this embodiment can also set variation in image brightness (variation in average luminance of all pixels included in an SEM image) as a determination reference instead of the image contrasts. In that case, the operator designates allowable brightness variation in the 1204 section and inputs a tolerance (in FIG. 12, twenty gradations). In the case of a wafer holder selection flow in this embodiment, it is necessary to acquire an image of a local position on the wafer and perform image processing (step 1105 in FIG. 11). Since time is required for this processing, time itself required for the wafer holder determination is longer than that in the flow of the first embodiment. However, the determination flow of this embodiment for determining propriety of selection of a holder according to an image is more direct and higher in accuracy in terms of realizing "an electron beam wafer inspection apparatus having, in the wafer outer circumferential portion, inspection performance equivalent to that in the wafer center portion" than that in the first embodiment.

(Third Embodiment)

In the charged particle beam apparatuses according to the first and second embodiments, the configuration including the physically different plural sample covers is explained. In this embodiment, a configuration example of a charged particle beam apparatus capable of adjusting charging characteristics of a sample cover is explained.

The charged particle beam apparatus according to this embodiment is a wafer inspection apparatus (an SEM type wafer inspection apparatus) employing a scanning electron microscope. Since the configuration itself of the scanning electron microscope is the same as those of the apparatuses according to the first and second embodiments, explanation of the configuration is omitted.

Figure 13:
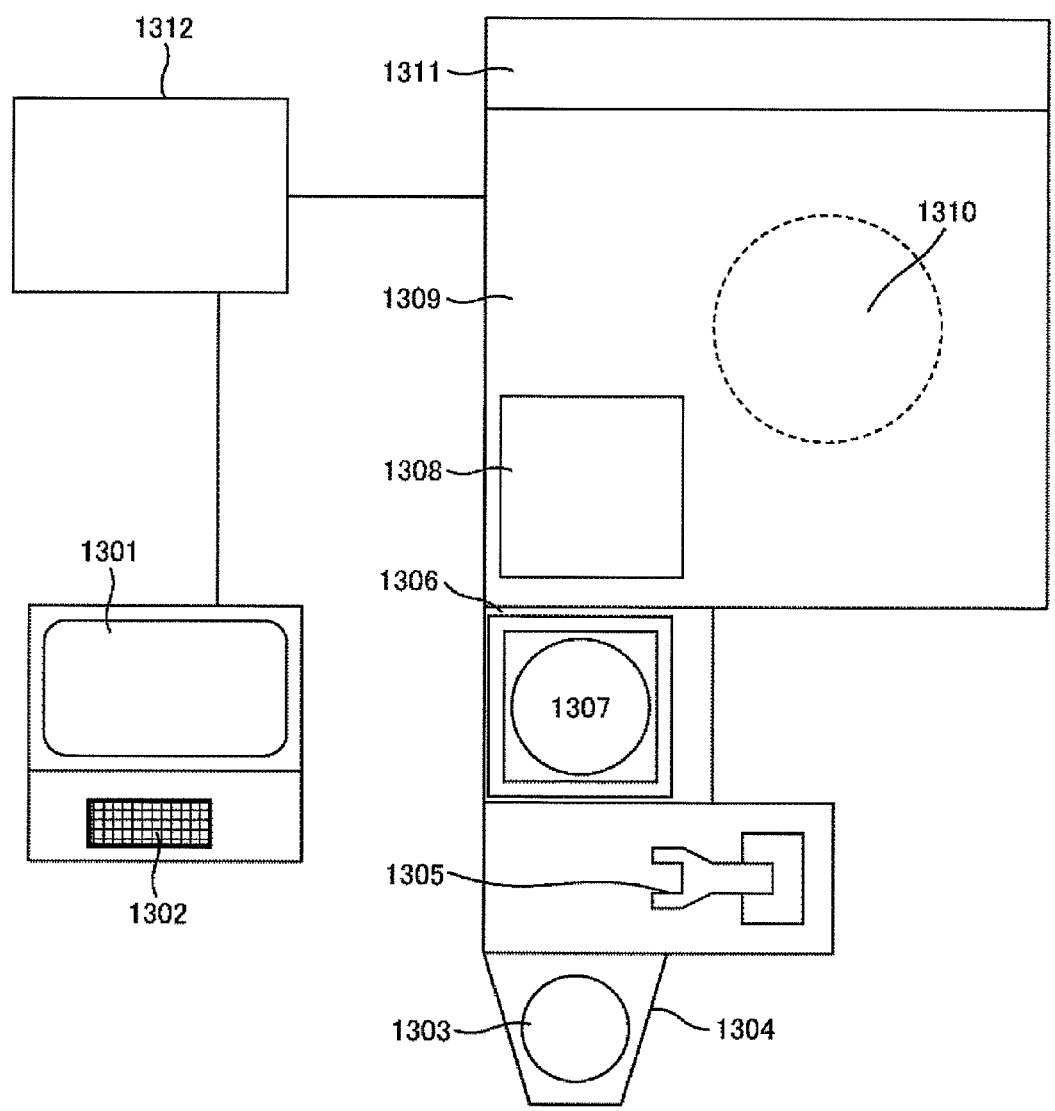
FIG. 13 is a top view showing an overall configuration of a charged particle beam inspection apparatus according to a third embodiment.

In FIG. 13, a top view of the charged particle beam apparatus according to this embodiment is shown. An operation screen 1301 and an operation keyboard 1302 are operation means used by an apparatus operator. Information and data necessary for control of the apparatus are input to the operation screen 1301 and the operation keyboard 1302. The configurations and the functions of a wafer pod 1304, a conveying arm 1305, a load-lock chamber 1306, a wafer holder 1307, a sample chamber 1309, an SEM lens barrel 1310, and an image processing device 1311 are the same as the configuration of the first and second embodiments (FIG. 3). However, in the configuration of this embodiment, only one load-lock chamber 1306 is provided. This is because, since a wafer holder itself including a sample cover includes a function of adjusting charging characteristics, it is unnecessary to prepare plural wafer holders 1307. Details are explained later.

Figure 14:
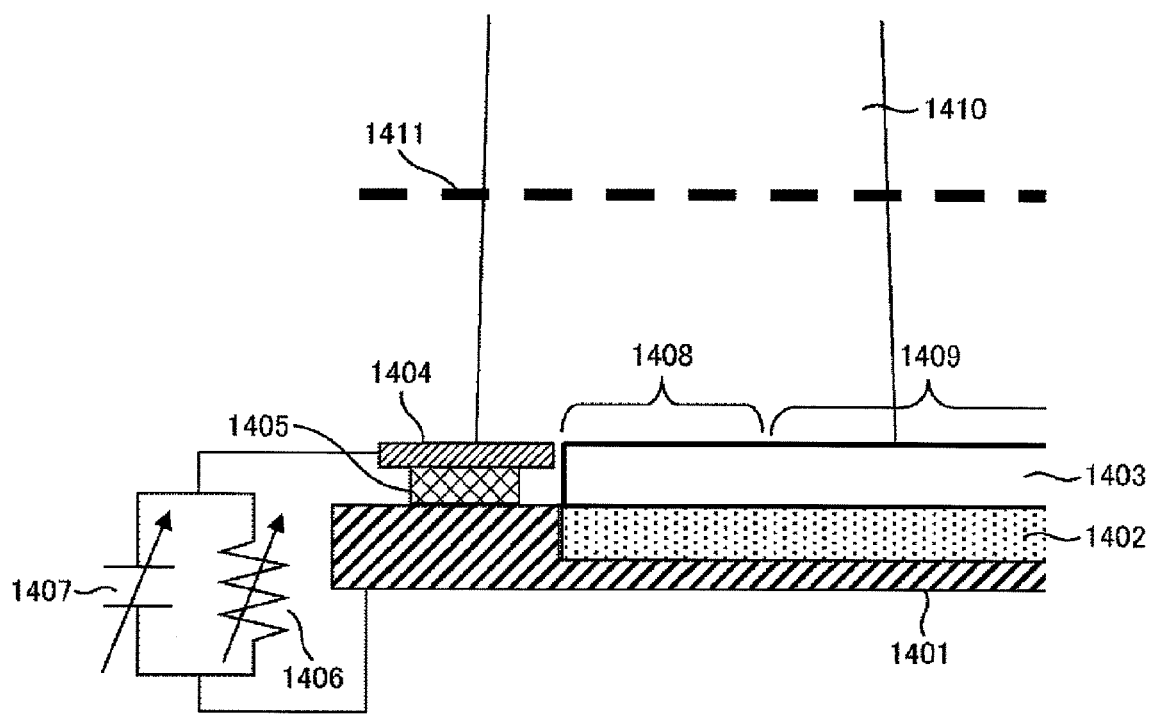
FIG. 14 is a schematic diagram showing a cross section of a sample holder of the charged particle beam inspection apparatus according to the third embodiment.

In FIG. 14, details of the wafer holder are shown. An electrostatic chuck plate 1402 is fixed to a wafer holder 1401. A wafer 1403 is held by the electrostatic chuck plate 1402. A conductive sample cover 1404 is arranged on the outer side of the wafer 1403. The sample cover 1404 and the holder 1401 are insulated by an insulating material 1405. The wafer holder according to this embodiment includes, in addition to the sample cover 1404, a variable capacitor 1407 and a variable resistor 1406 for adjusting the capacitance and the resistance of the sample cover. The variable capacitor 1407 and the variable resistor 1406 are a part of a control circuit like 210 and 212 shown in FIG. 2 and are mounted in the control power supply 125 shown in FIG. 1.

The variable resistor 1406 and the variable capacitor 1407 are connected in parallel to each other and connected to the sample cover 1404 and the holder 1401 by wires. The sample cover 1404 is made of a conductive material. However, electrical characteristics such as resistance and capacitance are desirably closer to those of a wafer to be inspected. Therefore, for example, silicon nitride or the like is used. A material obtained by forming a film of silicon nitride on usual silicon may be used. Alternatively, as explained in the first embodiment, silicon added with an impurity element for adjusting charging characteristics or silicon, on the surface of which wiring patterns, plugs, and the like are formed, may be used.

When a wafer outer circumferential portion 1408 is preliminarily charged, the sample cover 1404 is preliminarily charged such that a preliminary charging beam 1410 is irradiated on the sample cover 1404 as well. The size of the sample cover 1404 is the same as the size of the member 404 explained using FIG. 4. The thickness of the sample cover 1404 is set sufficiently large to prevent the preliminary charging beam 1410 from piercing through the sample cover 1404. When setting values of the variable resistor 1406 and the variable capacitor 1407 are appropriately selected, a voltage is generated in the sample cover 1404 to the same degree as that in the wafer 1403 by the preliminary charging beam 1410. The wafer outer circumferential portion 1408 can obtain a charging voltage same as that in a wafer center portion 1409. 1411 denotes a control electrode.

Figure 15:
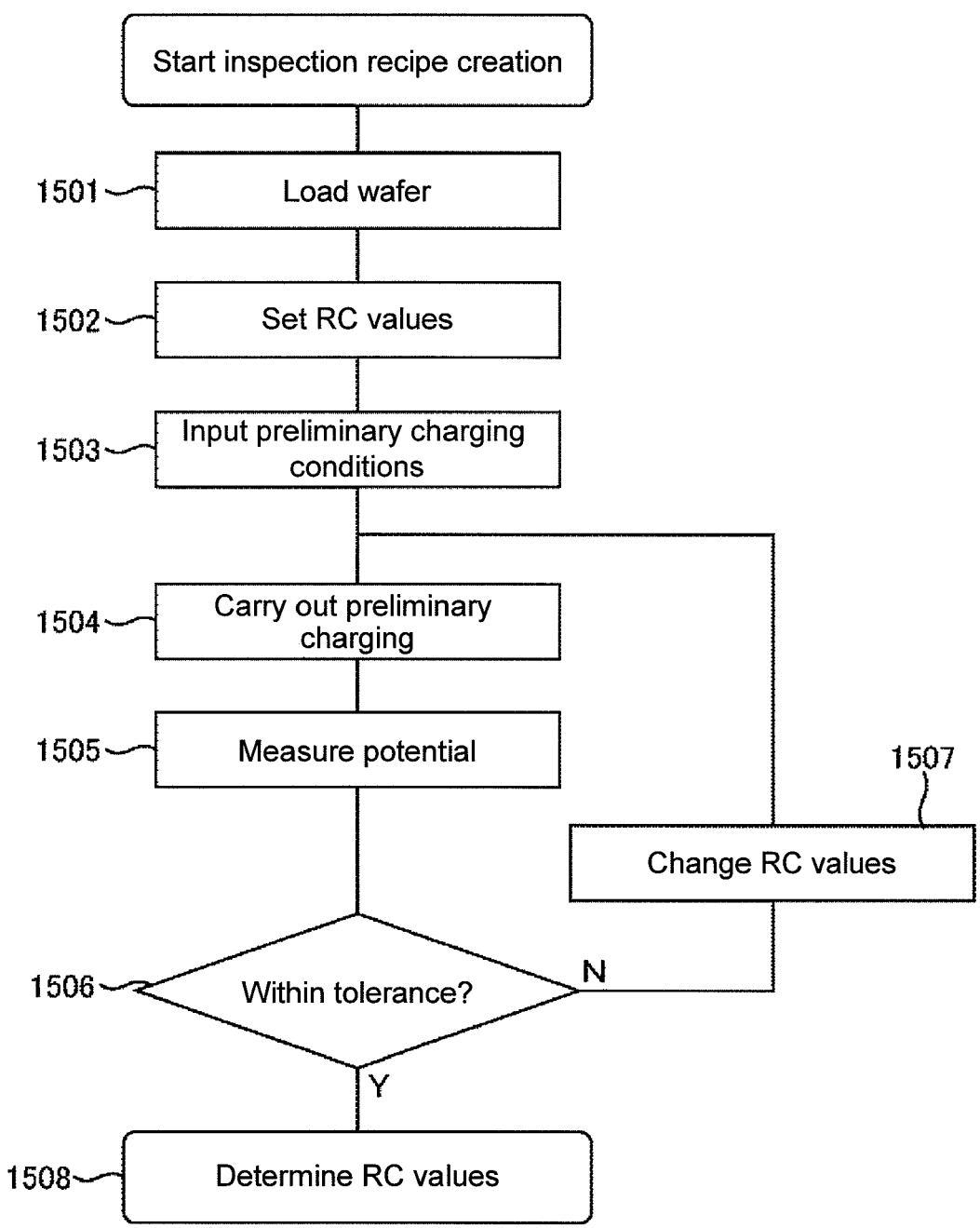
FIG. 15 is a configuration example of an electrical characteristic adjustment flow of a sample cover of the charged particle beam inspection apparatus according to the third embodiment.

In FIG. 15, an example of a flow indicating a way of deciding setting values (hereinafter, RC values) of a variable resistor 1506 and a variable capacitor 1507 is shown. First, in step 1501, the operator loads a wafer. In step 1502, the operator inputs provisional RC values. In step 1503, the operator inputs preliminary charging conditions such as an irradiation current amount, a control voltage, a preliminary charging range, continuous moving speed of a stage, and a continuous moving path of the stage. In step 1504, the operator carries out preliminary charging. After the end of the preliminary charging, in step 1505, the central control unit 314 acquires a charging voltage distribution in the wafer. Distribution measurement conforms to the contents explained using FIG. 8. It is assumed that, as a result of performing the distribution measurement, deviation between a charging voltage of the wafer outer circumferential portion and a charging voltage of the wafer center portion is larger than a separately-set tolerance. In this case, the central control unit 314 determines in determination in step 1506 that charging of the wafer outer circumferential portion is not optimum. In step 1507, the central control unit 314 changes the RC values and returns to step 1504. The central control unit 314 repeats steps 1504 to 1506 until the deviation falls within the tolerance. If the deviation falls within the tolerance, the central control unit 314 determines in the determination in step 1506 that charging of the wafer outer circumferential portion is optimum and determines RC values optimum for inspection (step 1508). Since it is difficult to optimize the RC values through trial and error, actually, optimum values of RC with respect to characteristic information of the wafer such as a wiring pattern and a wiring material of the wafer or the thicknesses of a wire and an insulating film are processed into a database and stored in the image processing device 1311. During execution of the flow shown in FIG. 15, initial values of RC are set with reference to the database such that the central control unit 314 passes through the determination step in step 1506 only once.

Figure 16:
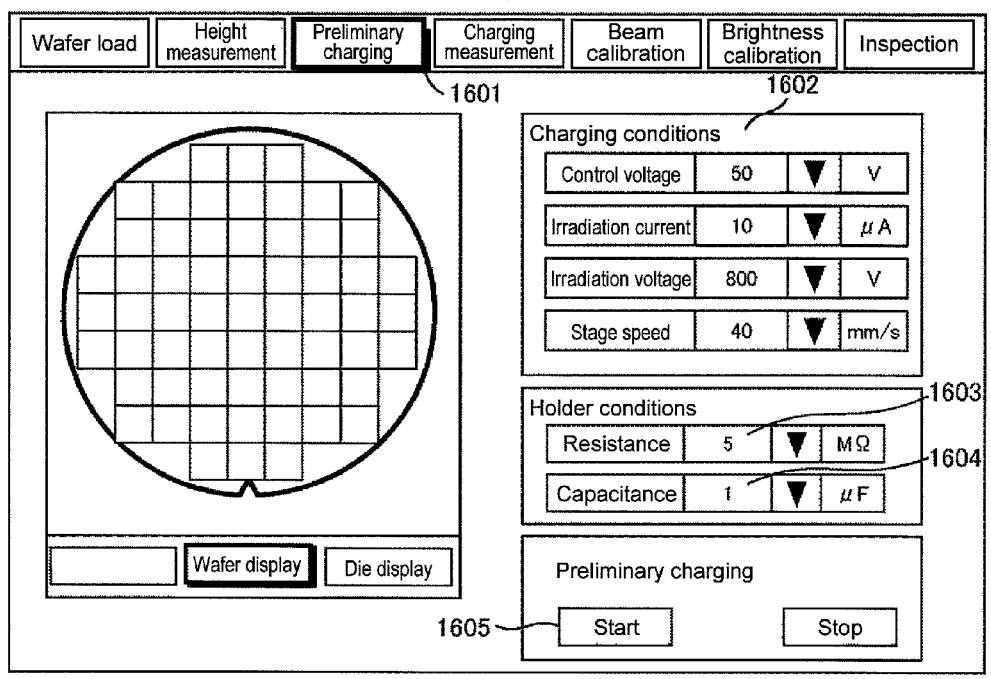
FIGS. 16(a) and (b) are configuration examples of an operation screen for adjusting electrical characteristics of the sample cover.
Figure 16:
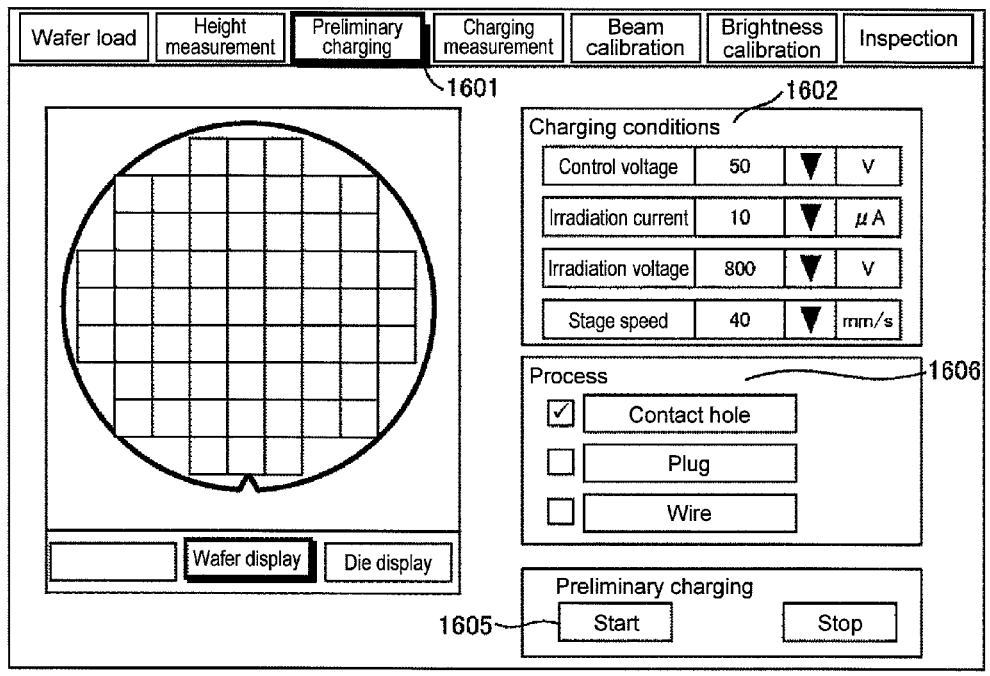

When the RC values are changed in step 1507, the operator performs input work for RC values. An operation screen for the input work is shown in FIG. 16. FIG. 16(a) is an operation screen in the case in which RC values are directly designated. After selecting a preliminary charging tab 1601 of the operation screen, the operator sets resistance 1603 and capacitance 1604 as holder conditions. The operator inputs conditions for preliminary charging in a 1602 space, presses a preliminary charging start button 1605, and starts the preliminary charging. FIG. 16(b) is an operation screen in the case in which RC values are indirectly designated from a manufacturing process for a wafer to be inspected. After selecting the preliminary charging tab 1601 of the operation screen, the operator selects process conditions in 1606. In respective processes, RC values are determined in advance. The operator inputs conditions for preliminary charging in the 1602 space, presses the preliminary charging start button 1605, and starts the preliminary charging. Determination of a charging measurement result is performed according to FIG. 8 as in the first embodiment.

Figure 17:
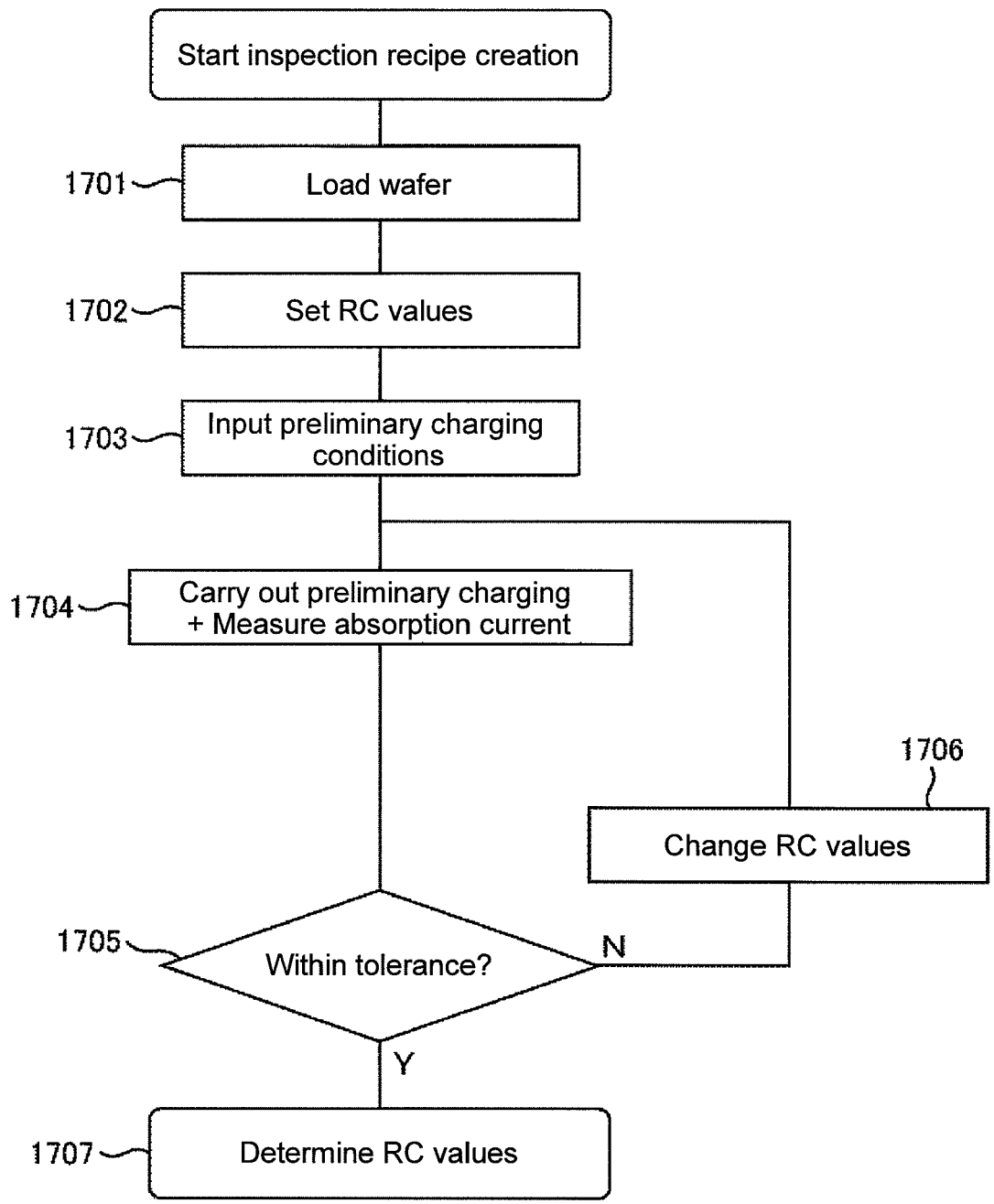
FIG. 17 is another configuration example of the electrical characteristic adjustment flow of the sample cover according to the third embodiment.

As another method of determining RC values, while the preliminary charging is carried out, an absorption current flowing to the wafer may be measured to determine on the basis of a measurement result whether the RC values are appropriate or inappropriate. A flow of the method is shown in FIG. 17. In step 1701, the operator loads a wafer. In step 1702, the operator inputs provisional RC values. In step 1503, the operator inputs preliminary charging conditions such as an irradiation current amount, a control voltage, a preliminary charging range, continuous moving speed of the stage, and a continuous moving path of the stage. In step 1704, the central control unit 314 carries out preliminary charging and stores an absorption current amount during pre-charge. After the end of the preliminary charging, in step 1705, the central control unit 314 compares the magnitude of variation of a measured absorption current and the magnitude of a separately-set tolerance. It is assumed that the variation of the absorption current is larger than the tolerance. In this case, the central control unit 314 determines in the determination in step 1705 that charging of the wafer outer circumferential portion is not optimum. In step 1706, the central control unit 314 changes the RC values. In step 1704, the operator performs the preliminary charging again. If the variation falls within the tolerance as a result of the determination in step 1705, the central control unit 314 determines that charging of the wafer outer circumferential portion is optimum and determines RC values (step 1707). Determination of an absorption current measurement result conforms to FIG. 10 as in the first embodiment.

Figure 18:
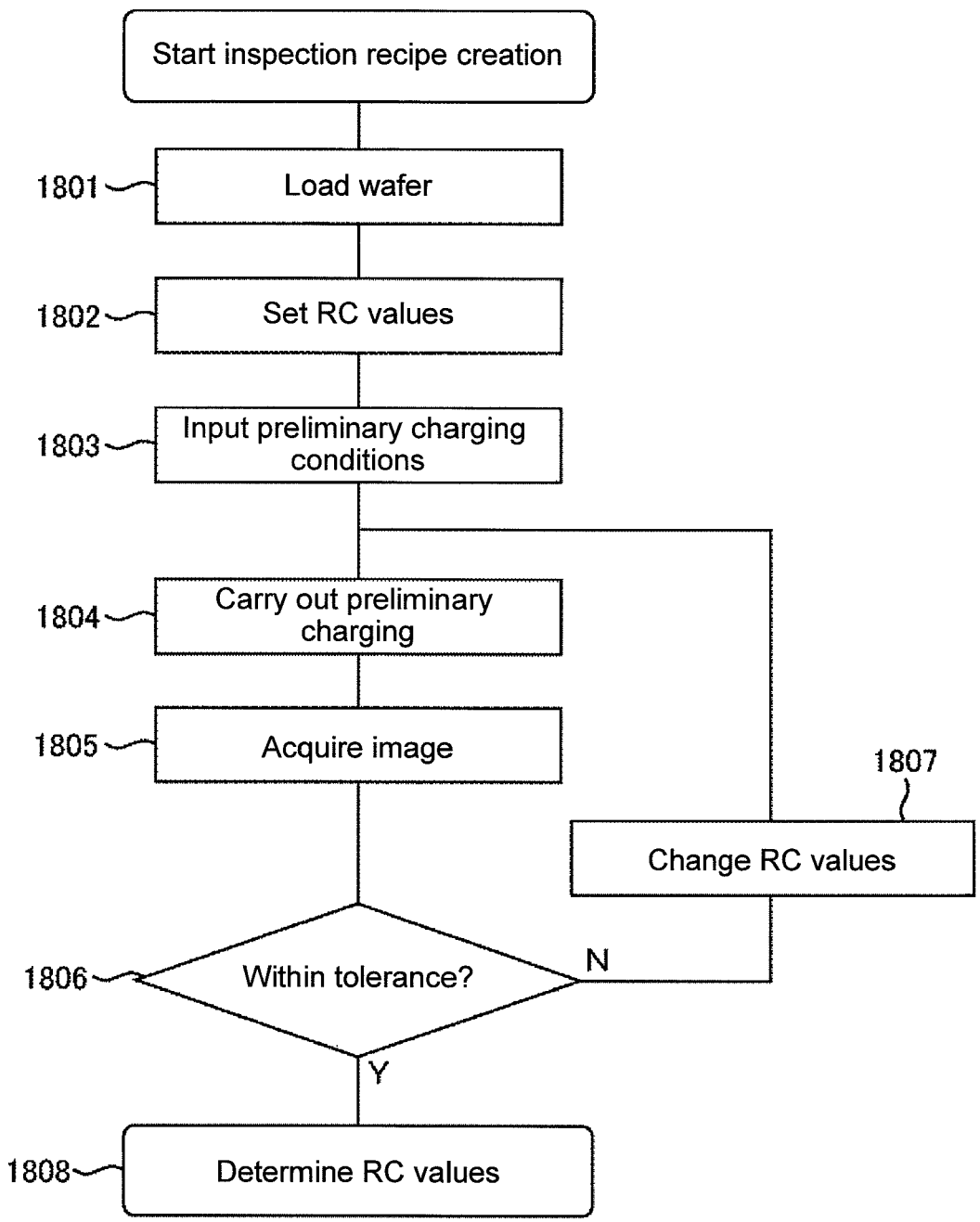
FIG. 18 is still another configuration example of the electrical characteristic adjustment flow of the sample cover according to the third embodiment.
Figure 19:
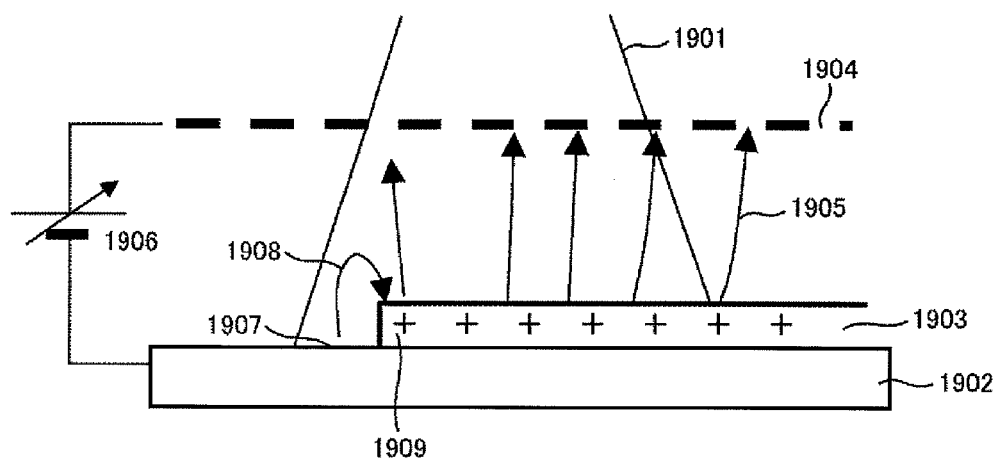
FIGS. 19(a) and (b) are schematic diagrams for explaining problems of positive charging and negative charging in the past.
Figure 19:
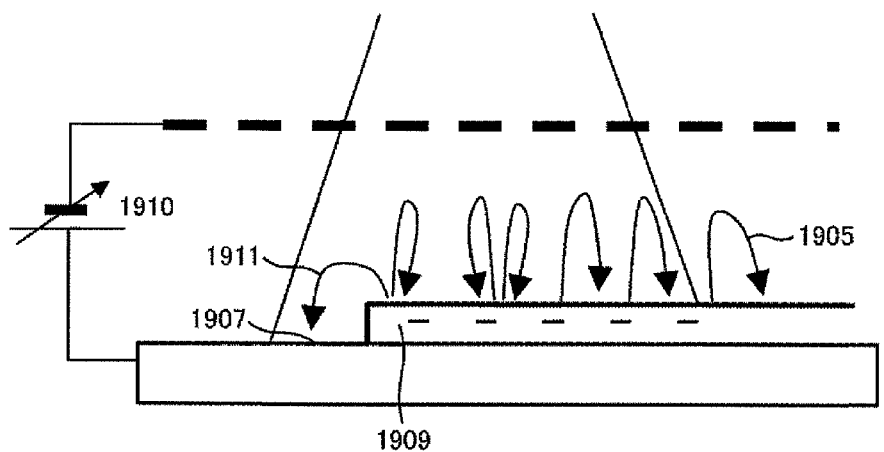
Figure 20:
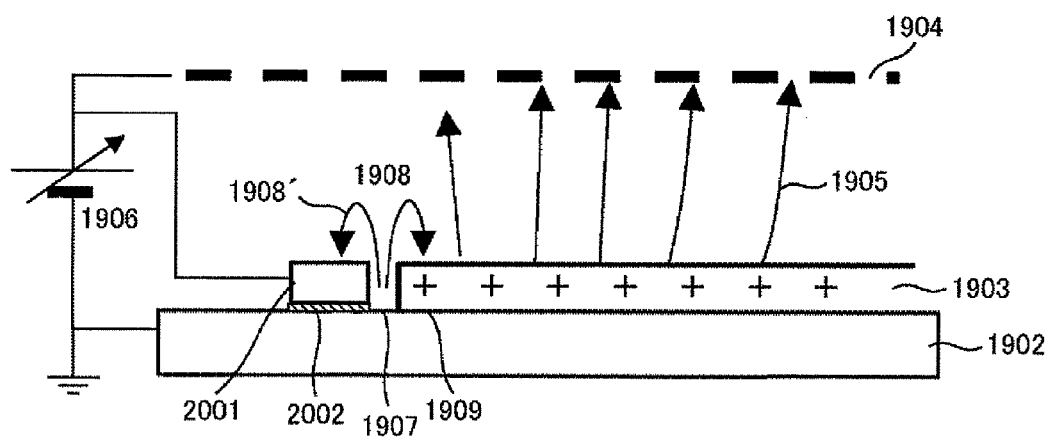
FIGS. 20(a) and (b) are schematic diagrams for explaining problems of a charging forming method by a wafer outer circumferential electrode.
Figure 20:
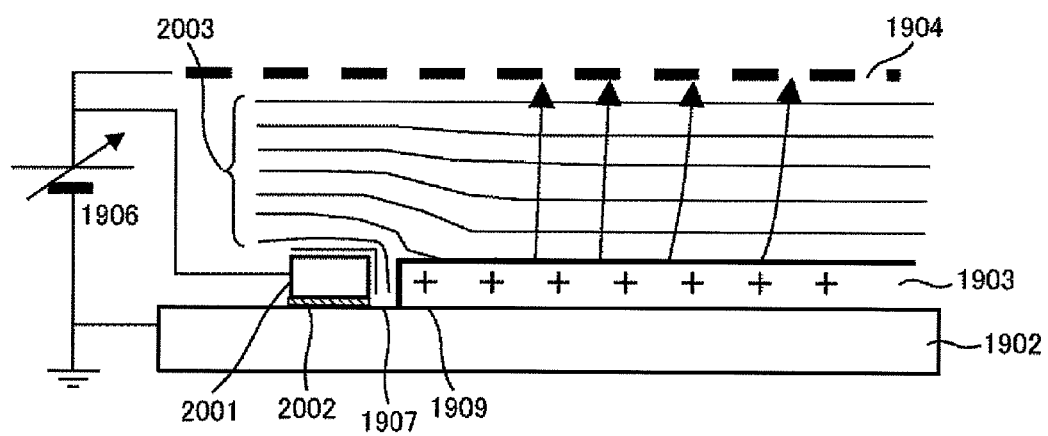

Alternatively, as another method of determining RC values, after the preliminary charging, the central control unit 314 acquires SEM images of the wafer center portion and the wafer outer circumferential portion. The central control unit 314 compares image contrasts of the wafer center portion and the wafer outer circumferential portion and, if a difference between the image contrasts is larger than a separately-set tolerance, the central control unit 314 changes the RC values. A flow of the method is shown in FIG. 18. In step 1801, the operator loads a wafer. In step 1802, the operator inputs provisional RC values. In step 1803, the operator inputs preliminary charging conditions such as an irradiation current amount, a control voltage, a preliminary charging range, continuous moving speed of the stage, and a continuous moving path of the stage. In step 1804, the operator carries out preliminary charging. After the end of the preliminary charging, in step 1805, the central control unit 314 acquires an SEM image in a certain place in the wafer surface. The place where the image is acquired may be several points if the points include the wafer outer circumferential portion or may be one point of the wafer outer circumferential portion if an image of the wafer center portion is known. In step 1806, the central control unit 314 compares the magnitude of deviation between an image contrast acquired in the wafer outer circumferential portion and an image contrast acquired in the wafer center portion and the magnitude of a separately-set variation tolerance. It is assumed that the deviation between the contrasts of the wafer outer circumferential portion and the wafer center portion is larger than the tolerance. In this case, the central control unit 314 determines in the determination in step 1806 that charging of the wafer outer circumferential portion is not optimum. In step 1807, the central control unit 314 changes the RC values. The operator performs the preliminary charging in step 1804 again. If the variation falls within the tolerance as a result of the determination in step 1805, the central control unit 314 determines that charging of the wafer outer circumferential portion is optimum and determines RC values (step 1807). As a determination reference based on an image, image brightness may be used instead of the contrasts.

In the configurations of the charged particle beam apparatuses explained in the first and second embodiments, the plural sample holders are physically prepared. There is actually difficulty in inspecting wafers having different charging characteristics. However, in the case of the charged particle beam apparatus according to this embodiment, even in wafers having totally different charging characteristics, it is possible to form a uniform charged state from the wafer center portion to the circumferential portion. Since only one preliminary load-lock chamber has to be provided, there is an advantage that manufacturing cost of the apparatus is also reduced. Since the determination of RC values does not involve unloading the wafer and can be continuously performed, compared with the first and second embodiments, it is possible to perform highly accurate wafer holder selection in a short time.

As in the first and second embodiments, the charging control mechanism according to this embodiment can also be applied to a charged particle beam apparatus that performs charging control using a primary charged particle beam rather than the charged particle beam source for preliminary charging. The charging control method according to this embodiment can also be applied to an inspection apparatus employing an ion beam processing unit or a helium ion microscope. Further, the charging control method can be applied to not only the wafer inspection apparatus but also a measuring apparatus and an observation apparatus Reference Signs List
101 electron gun for SEM
102 primary electron beam
103 beam limiting aperture
104 focusing lenses
105 object lens
106, 201, 303, 401, 503, 1303, 1403 wafers
107 deflector
108 signal electrons
109 signal electron detector
110 blanker
111 Faraday cup
112 signal processing unit
113 first image memory
114 second image memory
115 comparative operation unit
116 defect determining unit
117, 202 electron sources for preliminary charging
118, 211 control electrodes
119 surface potential meter
120, 209, 402, 501, 1307, 1401 wafer holders
121, 208, 502, 1402 electrostatic chuck plates
122 moving stage
123 vacuum container
124, 314, 1312 central control units
125 control power supply
203 planar electron beam
204 cathode
205 grid
206 cathode power supply
207 grid power supply
210, 511 power supplies for wafer holder
212, 512 control electrode power supplies
213, 510 absorption current meters
301, 1301 operation screens
302, 1302 operation keyboards
304, 1304 wafer pods
305, 1305 conveying arms
306, 1306 load-lock chambers
307 wafer holder A
308 wafer holder B
309 wafer holder C
310, 1308 sample stages
311, 1309 sample chambers
312 SEM lens barrel
313, 1311 image processing devices
403 irradiation spot of a preliminary charging beam
404, 504, 1404 sample covers
505, 1408 wafer outer circumferential portions
506, 1409 wafer center portions (inner circumferential portions)
507, 1410 charged particle beams for preliminary charging
508, 1411 charging control electrodes
509 potential distribution
1310 charged particle beam column
1405 insulating material
1406 variable resistance
1407 variable capacitor

The invention claimed is:

1. A charged particle beam apparatus comprising:
a charged particle column including a function of irradiating a primary charged particle beam on a sample and detecting a secondary charged particle generated by the irradiation;
a vacuum sample chamber arranged in a lower part of the charged particle column; and
a first sample replacement chamber and a second sample replacement chamber for storing a sample holder on which the sample is placed and carrying out the sample holder, on which the sample is placed, to the vacuum sample chamber, wherein
the first sample replacement chamber stores a first sample holder and the second sample replacement chamber stores a second sample holder,
the first sample holder and the second sample holder include sample covers formed in circumferences of sample placing surfaces, and
materials of the sample covers differ between the first sample holder and the second sample holder, and a charge of a charging voltage which is the same as that of the sample is generated in at least one of the first sample holder and the second sample holder by irradiation of a preliminary charging beam.

2. The charged particle beam apparatus according to claim 1, comprising a control device that determines, according to a type of the sample, which of the first sample holder and the second sample holder is used.

3. The charged particle beam apparatus according to claim 2, wherein the sample cover is formed of an insulator.

4. The charged particle beam apparatus according to claim 1, comprising a carry-in device for carrying the sample into the first sample replacement chamber or the second sample replacement chamber.

5. The charged particle beam apparatus according to claim 4, comprising a control device that determines, according to a type of the sample, into which of the first sample replacement chamber or the second sample replacement chamber the sample is carried.

6. The charged particle beam apparatus according to claim 5, comprising a screen display unit for inputting information to the control device, wherein an input request for identification information indicating a type of the sample and an input request for identification information indicating a type of a sample replacement chamber used for the sample are displayed on the screen display unit.

7. The charged particle beam apparatus according to claim 5, wherein the sample cover is formed of an insulator.

8. The charged particle beam apparatus according to claim 4, wherein the sample cover is formed of an insulator.

9. The charged particle beam apparatus according to claim 1, wherein the sample cover is formed of an insulator.

10. The charged particle beam apparatus according to claim 1, comprising a screen display unit for setting control information of the charged particle beam apparatus, wherein an input request for identification information indicating a type of the sample and an input request for identification information indicating a type of a sample holder used for the sample are displayed on the screen display unit.

11. The charged particle beam apparatus according to claim 1, comprising a screen display unit on which a first charging map indicating a charged state of the sample corresponding to the first sample holder and a second charging map indicating a charged state of the sample corresponding to the second sample holder are displayed.

12. A charged particle beam apparatus comprising:

a charged particle column including a function of irradiating a primary charged particle beam on a sample and detecting a secondary charged particle generated by the irradiation; and a vacuum sample chamber arranged in a lower part of the charged particle column, the vacuum sample chamber storing a sample holder on which the sample is placed, wherein the sample holder includes a sample cover formed in a circumference of a sample placing surface, the charged particle beam apparatus further comprises a unit for adjusting an electrical characteristic of the sample cover, and the unit for adjusting the electrical characteristic of the sample cover comprises: a resistor and a capacitor connected to the sample cover; and a unit for applying a voltage to the resistor and the capacitor.

13. The charged particle beam apparatus according to claim 12, wherein the resistor and the capacitor are a variable resistor and a variable capacitance capacitor, and the charged particle beam apparatus comprises a control device that adjusts setting values of the variable resistor and the variable capacitance capacitor according to a charging characteristic of the sample.

14. The charged particle beam apparatus according to claim 12, comprising a screen display unit on which a charging map indicating a charged state of the sample corresponding to an electrical characteristic of the sample holder is displayed.

* * * * *